United States Patent [19]
Yoshimura et al.

[11] Patent Number: 5,898,477
[45] Date of Patent: Apr. 27, 1999

[54] EXPOSURE APPARATUS AND METHOD OF MANUFACTURING A DEVICE USING THE SAME

[75] Inventors: Keiji Yoshimura; Kunitaka Ozawa, both of Utsunomiya; Hiroshi Kurosawa, Matsudo; Noriyasu Hasegawa, Utsunomiya, all of Japan

[73] Assignee: Canon Kabushiki Kaisha, Tokyo, Japan

[21] Appl. No.: 08/782,297

[22] Filed: Jan. 15, 1997

[30] Foreign Application Priority Data

Jan. 17, 1996 [JP] Japan ................................. 8-023226
Jan. 10, 1997 [JP] Japan ................................. 9-014555

[51] Int. Cl.⁶ .......................... G03B 27/42; G03B 27/32
[52] U.S. Cl. .................................... 355/53; 355/77
[58] Field of Search ............................ 355/53, 67, 71, 355/77, 35; 250/492.2, 492.22; 356/399, 400, 401

[56] References Cited

U.S. PATENT DOCUMENTS

| | | | |
|---|---|---|---|
| 3,823,318 | 7/1974 | Krause | 250/214 P |
| 4,519,692 | 5/1985 | Michalik | 354/412 |
| 4,711,568 | 12/1987 | Torigoe et al. | 355/68 |
| 4,804,978 | 2/1989 | Tracy | 346/108 |
| 4,822,975 | 4/1989 | Torigoe | 219/121.85 |
| 4,884,101 | 11/1989 | Tanimoto | 355/68 |
| 4,947,047 | 8/1990 | Muraki | 250/492.2 |
| 4,947,919 | 8/1990 | Muraki et al. | 350/6.6 |
| 4,970,546 | 11/1990 | Suzuki et al. | 355/53 |
| 5,053,614 | 10/1991 | Yui et al. | 250/205 |
| 5,107,275 | 4/1992 | Tsuruoka et al. | 346/1.1 |
| 5,119,390 | 6/1992 | Ohmori | 372/25 |
| 5,171,965 | 12/1992 | Suzuki et al. | 219/121.6 |
| 5,191,374 | 3/1993 | Hazama et al. | 355/43 |
| 5,250,797 | 10/1993 | Sano et al. | 250/205 |
| 5,329,336 | 7/1994 | Hirano et al. | 355/53 |
| 5,475,491 | 12/1995 | Shiozawa | 356/394 |
| 5,491,534 | 2/1996 | Shiozawa | 355/69 |
| 5,591,958 | 1/1997 | Nishi et al. | 250/205 |
| 5,604,566 | 2/1997 | Mano et al. | 355/70 |
| 5,627,627 | 5/1997 | Suzuki | 355/68 |
| 5,644,383 | 7/1997 | Mori | 355/68 |
| 5,661,546 | 8/1997 | Taniguchi | 355/53 |

FOREIGN PATENT DOCUMENTS

| | | |
|---|---|---|
| 61-97830 | 5/1986 | Japan . |
| 4-69660 | 3/1992 | Japan . |
| 5-62876 | 3/1993 | Japan . |
| 7-74092 | 3/1995 | Japan . |

*Primary Examiner*—Safet Metjahic
*Assistant Examiner*—Hung Henry Nguyen
*Attorney, Agent, or Firm*—Fitzpatrick, Cella, Harper & Scinto

[57] ABSTRACT

An exposure apparatus includes a mask scanning device for scanning a mask on which a pattern is formed, a projection optical system for projecting the pattern on the mask onto a wafer, a wafer scanning device for scanning the wafer, onto which the pattern is projected by the projection optical system, an illuminating device for illuminating the mask in an illumination area narrower than the pattern by synchronously scanning the mask and the wafer relative to each other, using the mask scanning device and the wafer scanning device, so as to expose and transfer the pattern on the wafer, a detection device for detecting information regarding exposure before exposing and transferring the pattern onto the wafer by the illuminating device and for producing detection results, and a display for displaying exposure information obtained from the detection results. Also disclosed are methods of manufacturing semiconductor devices, for example, using such an exposure apparatus.

39 Claims, 21 Drawing Sheets

POSITION

DISPLAY RANGE ——————————————————— 0~XX
VARIATIONS IN DISPLAY RANGE MEASURING ——— YY%
DISPLAY RANGE MEASURING ——————————— ZZ%

| | | position [mm] | | | | |
|---|---|---|---|---|---|---|
| | | 0 | 0.1 | 0.2 | 0.3 | · · · |
| Measuring Time | 1 | | | | | |
| | 2 | | | | | |
| | 3 | | | | | |
| | 4 | | | | | |
| | 5 | | | | | |
| | 6 | | | | | |
| | 7 | | | | | |
| | ⋮ | | | | | |

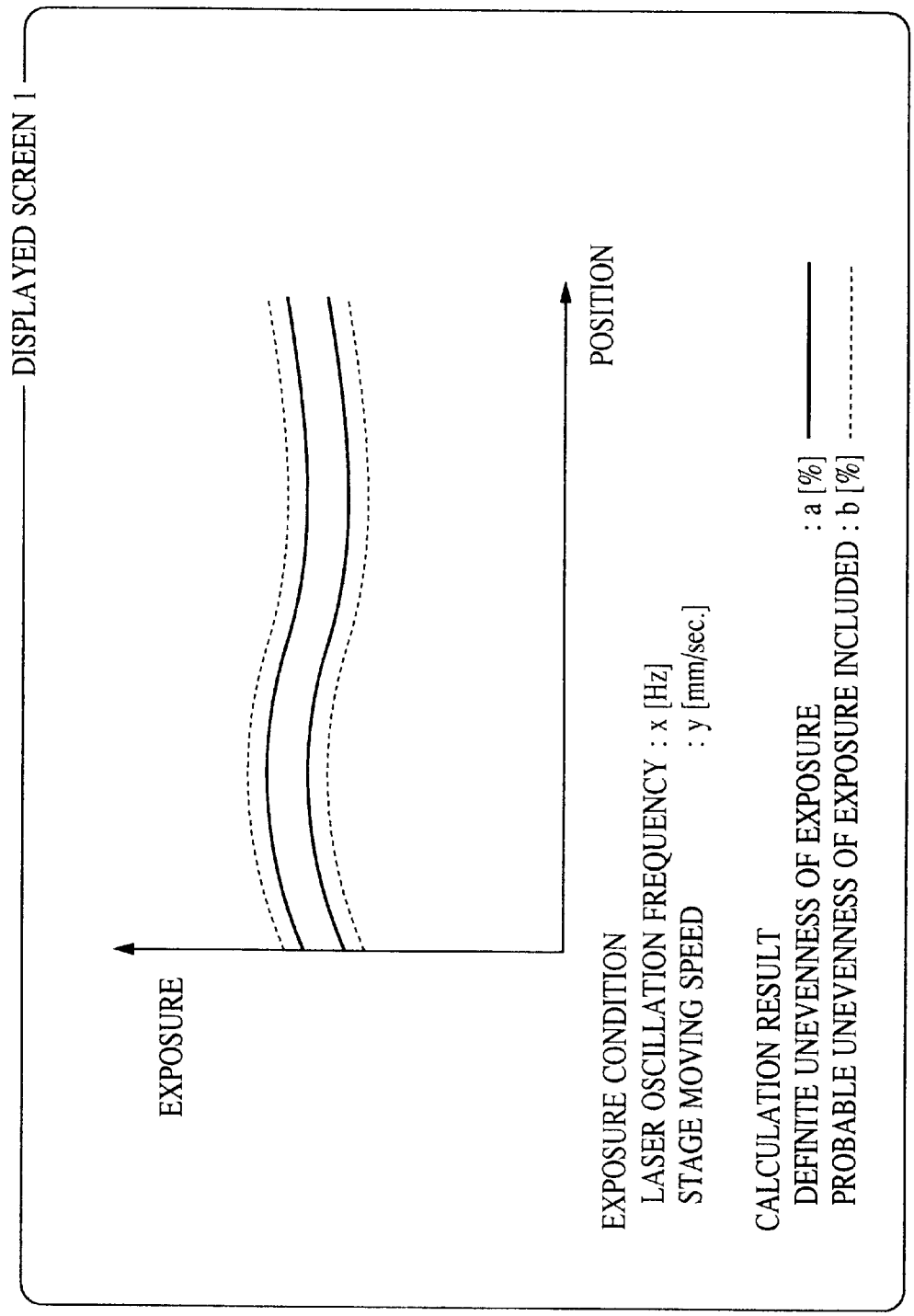

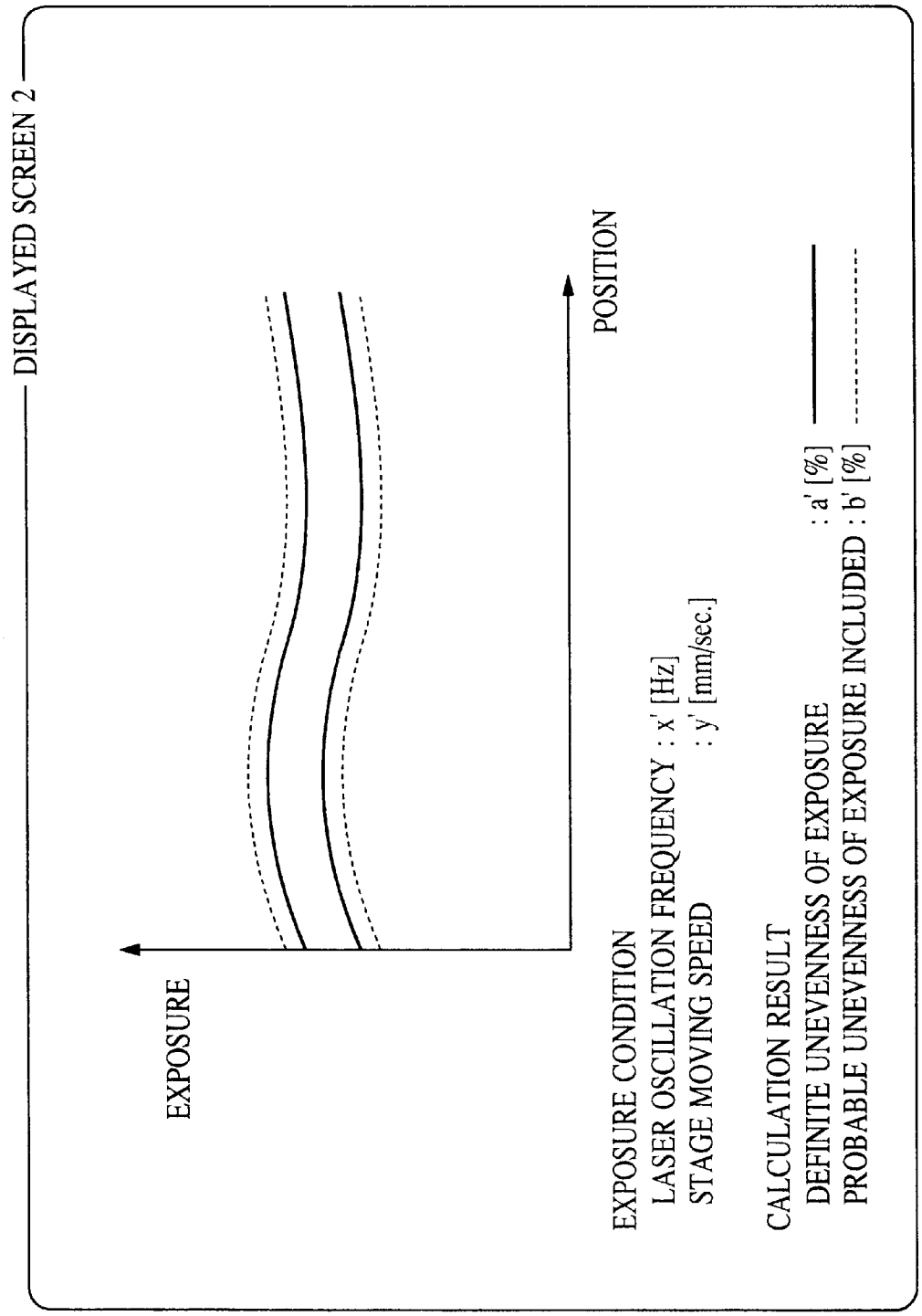

EXPOSURE APPARATUS AND METHOD OF MANUFACTURING A DEVICE USING THE SAME

BACKGROUND OF THE INVENTION

1. Field of the Invention

The present invention relates to an exposure apparatus, and more particularly, to a scanning exposure apparatus which performs projection exposure while synchronously scanning a mask and a wafer.

2. Description of the Related Art

As integrated circuit (IC) patterns have become finer and have been made on a larger scale, an exposure apparatus used in a lithography process employs a system which is widely different from a conventional system.

For example, an excimer laser for emitting light having a wavelength shorter than that of an i-line emitted from a conventional mercury vapor lamp is employed as a light source so as to serve the need for fine IC patterns. In addition, a step-and-scan exposure apparatus is employed so as to serve the need for large-scale IC patterns.

The excimer laser is a pulsed light source accompanied by variations in emission intensity at each emission. Therefore, when the excimer laser is employed in the scanning exposure apparatus, it is necessary to control exposure in some way in order to expose a wafer with the desired exposure amount.

Although various methods of controlling exposure have been conventionally proposed, the scanning exposure apparatus uses many parameters for controlling the exposure. Therefore, it is very important to provide an operator with various information regarding exposure before exposing the wafer. In addition, it is also very important to provide the operator with information such as what processes are being performed, and whether or not any problem has occurred.

SUMMARY OF THE INVENTION

An object of the present invention is to provide an exposure apparatus which can suitably output necessary information to an operator.

According to an aspect of the present invention, there is provided an exposure apparatus, including mask scanning means for scanning a mask on which a pattern is formed, a projection optical system for projecting the pattern on the mask onto a wafer, wafer scanning means for scanning the wafer, onto which the patten is projected by the projection optical system, illuminating means for sequentially illuminating the mask in an illumination area narrower than the pattern by synchronously scanning the mask and the wafer relative to each other using the mask scanning means and the wafer scanning means, so as to expose and transfer the mask pattern onto the wafer, detection means for detecting information regarding exposure before exposing and transferring the pattern onto the wafer by the illuminating means, and for producing detection results, and display means for displaying exposure information obtained from the detection results.

It is preferable that the detection means comprises an illuminance measurement means for measuring illuminance of the illumination area. It is more preferable that the illuminance measurement means comprises a line sensor having a plurality of light receiving elements aligned at least in a scanning direction. It is further preferable that the illuminance measurement means is disposed on the wafer scanning means.

It is also preferable that the information displayed on the display means includes at least one of an illuminance distribution of the illumination area, an integrated value of the illuminance in a direction perpendicular to the scanning direction of the illumination area, and an exposure distribution in a one-shot exposure area on the wafer.

According to another aspect of the present invention, there is provided an exposure apparatus, including mask scanning means for scanning a mask on which a pattern is formed, a projection optical system for projecting the pattern on the mask onto a wafer, wafer scanning means for scanning the wafer, onto which the patten is projected by the projection optical system, illuminating means for sequentially illuminating the mask in an illumination area narrower than the pattern by synchronously scanning the mask and the wafer relative to each other using the mask scanning means and the wafer scanning means, so as to expose and transfer the mask pattern onto the wafer, monitor means for monitoring a state of the transfer of the mask pattern during exposing and transferring of the pattern onto the wafer and for obtaining monitoring information, error detection means for detecting errors in the pattern transfer based on the monitoring information obtained by the monitor means and for producing error detection results, and output means for outputting information regarding the error detection results produced by the error detection means.

At this time, the error detection results include errors related to the exposure.

It is preferable that the errors related to the exposure include at least one of information showing error shots on the wafer, and information showing error chips contained within a one-shot exposure area on the wafer.

It is also preferable that the exposure apparatus includes display means for displaying the information regarding the error detection results produced by the error detection means and output by the output means.

According to a further aspect of the present invention, there is provided an exposure apparatus, including mask scanning means for scanning a mask on which a pattern is formed, a projection optical system for projecting the pattern on the mask onto a wafer, wafer scanning means for scanning the wafer, onto which the patten is projected by the projection optical system, illuminating means for sequentially illuminating the mask in an illumination area narrower than the pattern by synchronously scanning the mask and the wafer relative to each other using the mask scanning means and the wafer scanning means, so as to expose and transfer the mask pattern onto the wafer, monitor means for monitoring a state of the transfer of the mask pattern during exposing and transferring the pattern onto the wafer and for obtaining exposure information, and display means for displaying the exposure information obtained by the monitor means.

It is preferable that the monitor means comprises an exposure measurement means for measuring an amount of the exposure received by the wafer.

Various types of exposure apparatuses as described above may preferably include a light source for supplying pulsed light accompanied by energy variations at each emission of the pulsed light. The light source preferably may be an excimer laser.

According to the exposure apparatus of the present invention, semiconductor devices such as an IC and a large-scale integrated circuit (LSI), a liquid crystal device, an image pick-up device such as a charge coupled device (CCD) and a device such as a magnetic device can be precisely manufactured.

In another aspect, the present invention provides a method of manufacturing a device, comprising the steps of scanning a mask on which a pattern is formed, using a mask scanning device, projecting the pattern on the mask onto a wafer, using a projection optical system, scanning the wafer onto which the pattern is projected by the projection optical system, using a wafer scanning device, and sequentially illuminating the mask in an illumination area narrower than the pattern by synchronously scanning the mask and the wafer relative to each other, using the mask scanning device and the wafer scanning device, so as to expose and transfer the mask pattern onto the wafer to manufacture a device.

In a first aspect, the device manufacturing method of the present invention includes steps of detecting information regarding exposure, before exposing and transferring the pattern onto the wafer by the illuminating device, and producing detection results, and displaying exposure information obtained from the detection results.

In another aspect, the device manufacturing method of the present invention includes steps of monitoring a state of the transfer of the mask pattern during exposing and transferring of the mask pattern onto the wafer and obtaining monitoring information, detecting errors in the pattern transfer based on the monitoring information obtained in the monitoring step and producing error detection results, and outputting information regarding the error detection results in the error detection step.

In yet another aspect, the device manufacturing method of the present invention includes steps of monitoring a state of the transfer of the mask pattern during exposing and transferring of the pattern onto the wafer and obtaining exposure information, and displaying the exposure information obtained in the monitoring step.

BRIEF DESCRIPTION OF THE DRAWINGS

FIGS. 15A and 15B each illustrates an example in which an error range of the exposure distribution in the scanning direction obtained by calculation is displayed;

DESCRIPTION OF THE PREFERRED EMBODIMENTS

Figure 1:
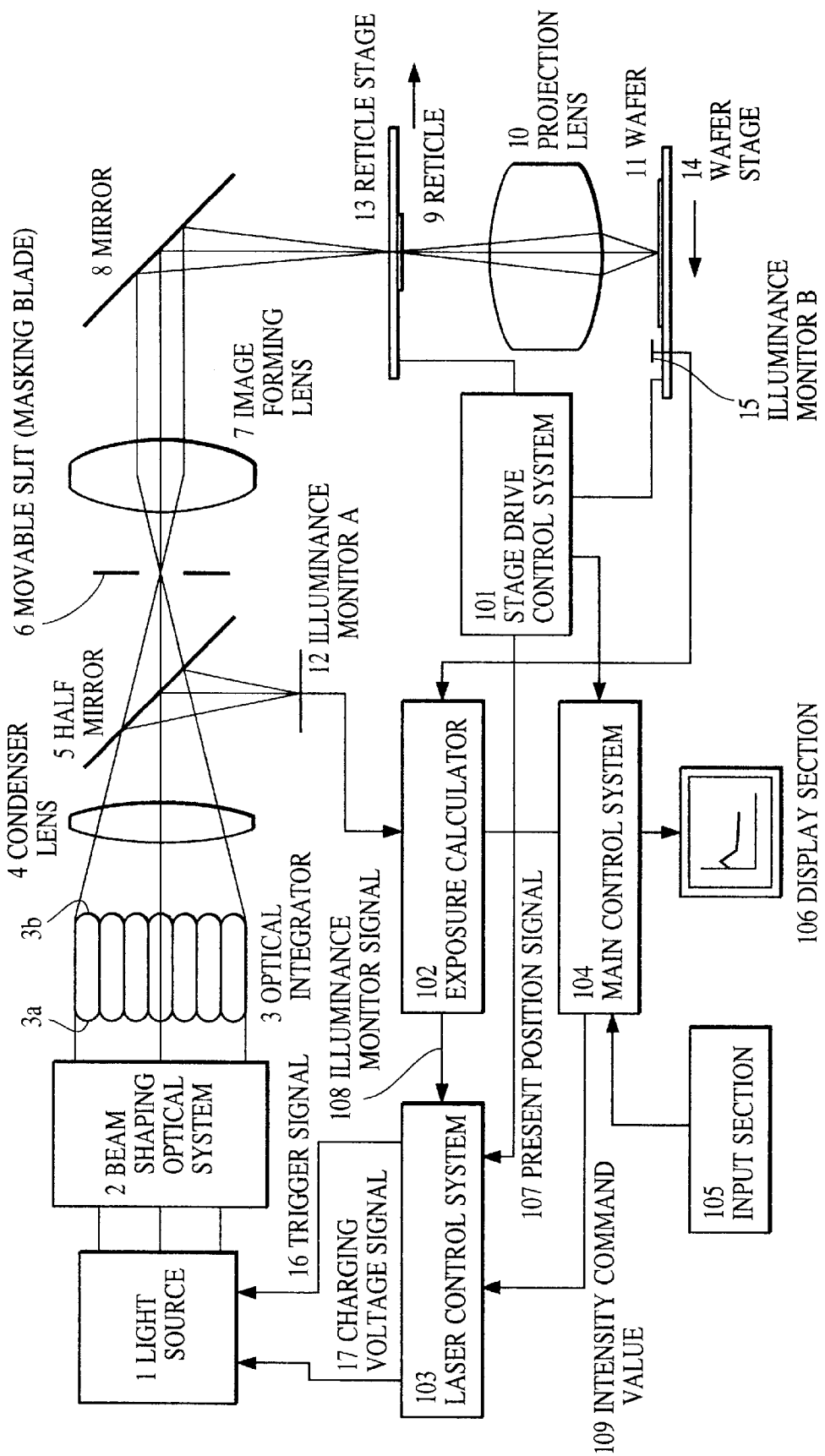
FIG. 1 schematically illustrates a main portion of a scanning exposure apparatus.

FIG. 1 illustrates a structure of a scanning exposure apparatus according to an embodiment of the present invention. In this embodiment, a step-and-scan exposure apparatus is described in which light flux emitted from a pulse source is applied to a reticle (mask) through an illumination optical system, and a circuit pattern formed on the reticle is reduced and projected by scanning with a projection lens (projection optical system) so as to be printed onto a wafer having a photosensitive material applied thereto. The exposure apparatus of this embodiment is suitably used for manufacturing semiconductor devices such as an IC and an LSI, an image-pickup device such as a CCD, and a magnetic head, for example.

Referring to FIG. 1, a light source 1 is composed of a pulsed laser such as an excimer laser and supplies pulsed light. A beam shaping optical system 2 shapes the light flux from the light source 1 into a predetermined form to be incident on a light incident surface 3a of an optical integrator 3. The optical integrator 3 consists of a fly-eye lens having a plurality of minute lenses, and a plurality of secondary light sources are formed in the vicinity of a light emergent surface 3b. A condenser lens 4 subjects a movable slit (masking blade) 6 to Kohler illumination with light flux from the secondary light source formed in the vicinity of the light emergent surface 3b of the optical integrator 3.

The light flux which has illuminated the movable slit 6 illuminates a reticle (mask) 9 via an image forming lens 7 and a mirror 8. The movable slit 6 is disposed at a position slightly shifted from the optical conjugate position of the reticle 9, and the shape of its opening defines the shape and size of an illumination area of the reticle 9. The movable slit 6 is, for example, provided with a voice coil motor (not shown), and a defocusing amount of the illumination area can be varied by moving the movable slit 6 toward the optical axis. An illuminance monitor A#12 detects the amount of light of a portion of the exposure light which has been divided by a half mirror 5, and outputs the signal to an exposure calculator 102.

An illumination optical system for supplying exposure light to the reticle 9 is composed of the beam shaping optical system 2, the optical integrator 3, the condenser lens 4, the movable slit 6, the image forming lens 7 and the mirror 8. In addition, the illumination optical system includes an extinction means (not shown) to control the amount of light flux illuminated from the light source 1 in multiple levels.

The reticle 9 is held by a reticle stage 13, and a circuit pattern is formed on the surface of the reticle 9. A projection lens (projection optical system) 10 reduces and projects a circuit pattern of the reticle 9 onto the wafer 11. A resist, which is a photosensitive material, is applied to the surface of the wafer 11, and the wafer 11 is placed on a three-dimensionally displaceable wafer stage 14.

An illuminance monitor B#15 is placed on the wafer stage 14, to thereby measure a beam intensity profile of the exposure light through the projection lens 10, as will be described later.

A stage drive control system 101 controls the reticle stage 13 and the wafer stage 14 so that they move in opposite directions at a fixed speed which is of the same ratio as the image forming magnification of the projection lens 10. The exposure calculator 102 converts electric signals corresponding to the intensity of the exposure light input from the illuminance monitors A#12 and B#15 into logical values to be output to a main control system 104. In this manner, information obtained from the illuminance monitors A#12 and B#15 are stored in a storage means (memory) provided within a main control system 104.

Since the illuminance monitor A#12 can measure the intensity during exposure, it is chiefly used for estimating an integrated value of exposure light illuminated from the slit. The illuminance monitor B#15 is used for measuring the beam intensity profile of exposure light which illuminates the wafer 11 through the projection lens 10 before the circuit pattern is actually printed on the wafer.

Since the absolute values of the beam intensities received by the illuminance monitor A#12 and the illuminance monitor B#15 are different from each other, a correlation of the measurements of the illuminance monitor A#12 with respect to the measurements of the illuminance monitor B#15 are determined in advance, so that the exposure on the wafer can be determined using the correlations of the actual exposure. In this embodiment, the illuminance monitor B#15 does not measure the exposure light intensity during exposure of the wafer.

In this embodiment, the illuminance monitor A#12 is used as an exposure monitor means so as to determine the exposure state on the wafer 11 (transfer state of the circuit pattern) during the actual exposure.

A laser control system 103 outputs a trigger signal 16 and a charging voltage signal 17 to the light source 1 in accordance with the desired exposure so as to control emission intensity and emission interval. When the laser control system 103 generates the trigger signal 16 and the charging voltage signal 17, an illuminance monitor signal 108 from the exposure calculator, a present stage position signal 107 from the stage drive control system 101 and history information from the main control system 104 are employed as parameters.

Allowable values for the desired exposure and unevenness of exposure are inputted to the main control system 104 from an input section 105, which is an operator-to-machine or a media interface. In addition, information for an operator, such as results obtained from the illuminance monitors A#12 and B#15, and the estimated value of the integrated exposure, can be displayed on a display section 106, as will be described later.

The main control system 104 calculates the parameter groups necessary for the scanning exposure from the data supplied by the input section 105, an inherent parameter of the exposure apparatus and the data obtained by the illuminance monitors A#12 and B#15, and transmits them to the laser control system 103 and the stage drive control system 101.

A method of measuring a beam intensity profile of pulsed light and correcting unevenness of exposure will now be described.

In a scanning exposure apparatus using a pulsed light source, such as an excimer laser, for manufacturing semiconductor devices, it is necessary to set a suitable emission intensity and oscillation frequency for the pulsed light (exposure light), a stage scanning speed, and a beam intensity profile (illuminance distribution) per one pulse of the exposure light, in order to obtain a uniform exposure on an exposure surface (wafer surface).

Figure 2:
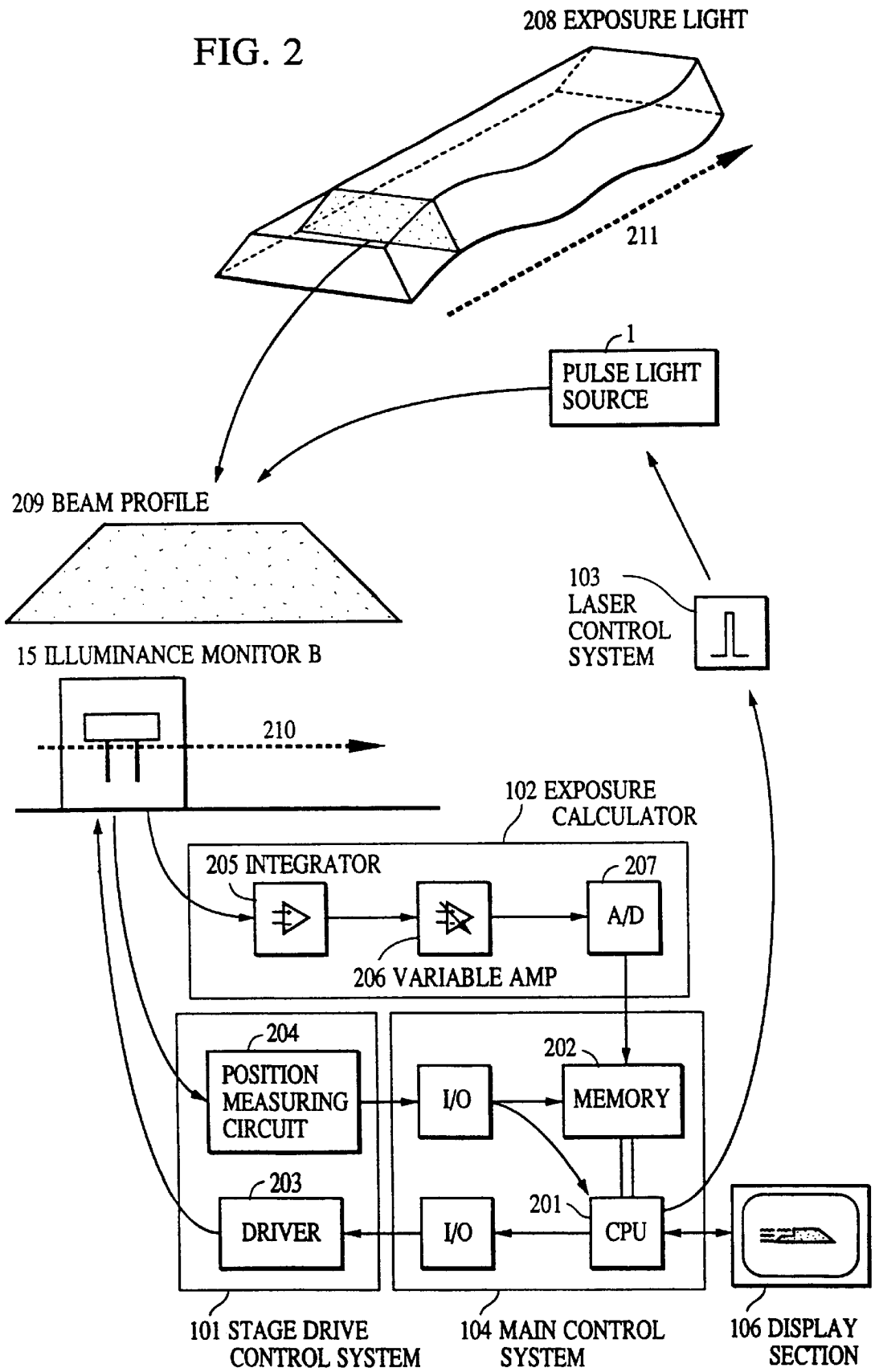
FIG. 2 illustrates the state of measurement of a beam intensity profile.

FIG. 2 illustrates the concept for measuring the beam intensity profile of the exposure light. Referring to FIG. 2, a CPU 201 instructs a driver circuit 203 to drive the wafer stage and the illuminance monitor B#15 to scan in a lateral direction 210 of an area illuminated by exposure light, and accelerates the illuminance monitor B#15 so that it reaches a target speed before arriving at the area where exposure light 208 is illuminated.

On the other hand, the CPU 201 measures the present position of the wafer stage, i.e., the illuminance monitor B#15, by means of a position measuring circuit 204. When the illuminance monitor B#15 is moved to a position illuminated by the exposure light, the laser control system 103, to which information regarding the movement of the illuminance monitor B#15 is inputted, sends a trigger signal to the light source 1 to oscillate the exposure light 208. During the illumination with exposure light, the illuminance monitor B#15 is moved to the end of a beam profile 209 while measuring light intensity at each movement position. An output from the illuminance monitor B#15 is integrated by an integrator 205, adjusted to a suitable value by a variable amplifier 206, and stored in a memory 202 via an A/D converter 207. At the same time, each measurement position is also stored in the memory 202.

The CPU 201 and the memory 202 constitute a portion of the main control system 104; the driver circuit 203 and the position measuring circuit 204 constitute a portion of the stage drive control system 101; and the integrator 205, the variable amplifier 206 and the A/D converter 207 constitute a portion of the exposure calculator 102.

By performing the above-described operations, each lateral beam profile of the illumination area of the exposure light 208 can be measured. By performing the above operations also in a longitudinal direction 211, beam profiles of the entire illumination area of the exposure light 208 can be measured.

Figures 3, 4:
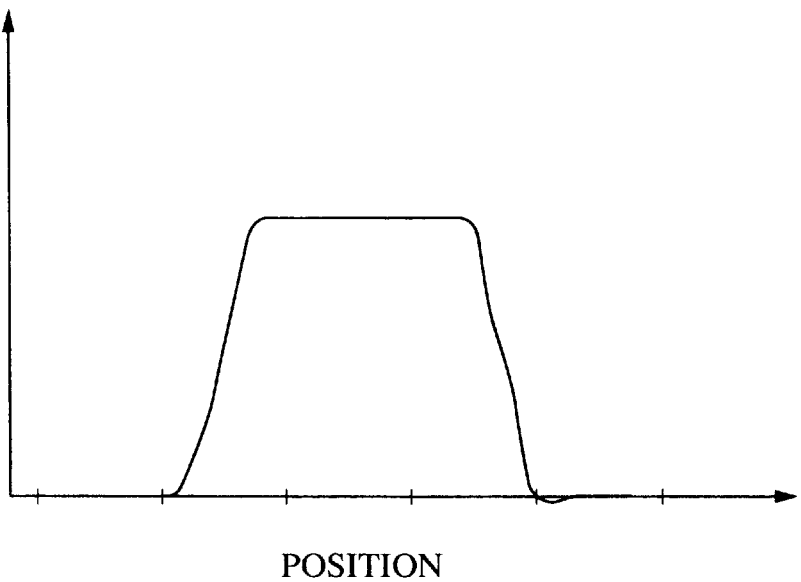
FIG. 3 illustrates an example in which the beam intensity profile is graphically displayed.
FIG. 4 illustrates an example in which the beam intensity profile is numerically displayed.

The beam intensity profile of the exposure light measured as described above can be graphically displayed as shown in FIG. 3, or it can be numerically displayed as shown in FIG. 4, on the display section 106. The operator can review the scanning speed and the number of measurement points of the illuminance monitor B#15, judging from the information displayed on the display section 106.

When the emission intensity varies in exposure light supplied by the excimer laser, a relative beam profile can be measured by normalizing every output of the illuminance monitor B#15 with the illuminance monitor A#12. In addition, since the shape of the beam intensity profile of the light source is likely to fluctuate, the beam intensity profile is preferably measured several times to reduce the influence of such a fluctuation.

Figure 5:
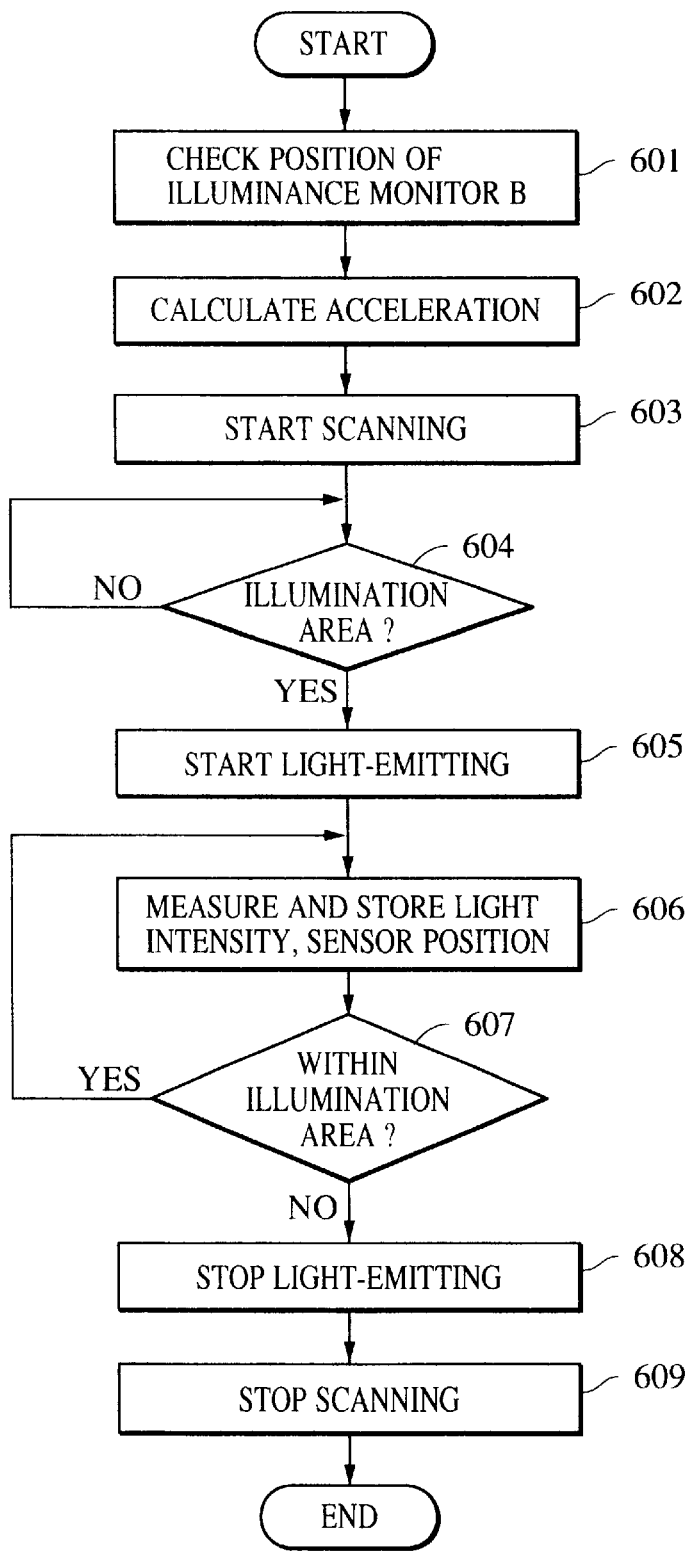
FIG. 5 is a flowchart showing the steps of measuring the beam intensity profile.

FIG. 5 is a flowchart showing the steps of measuring the beam intensity profile. The normalized value of the average of a position vector and a beam intensity distribution vector is the result of measurement of the shape of the beam intensity profile.

In step 601, the position of the illuminance monitor B#15 is checked. From the position of the illuminance monitor B#15 and the position illuminated by the exposure light, the speed of the wafer stage, on which the illuminance monitor B#15 is placed, is calculated in step 602, and scanning is started in step 603.

In step 604, whether the illuminance monitor B#15 reaches the illumination area of the exposure light is judged. When the illuminance monitor B#15 has reached the illumination area, emission of the exposure light is started in step 605, and the measured light intensity and the measurement position are stored in the memory in step 606. In step 607, the position of the illuminance monitor B#15 is monitored. When the illuminance monitor B#15 leaves the illumination area of the exposure light, laser beam emission is stopped in step 608, and scanning of the illuminance monitor B#15 is stopped in step 609.

As shown in FIG. 5, by repeating the operation such that the illuminance monitor B#15 scans in a lateral direction of the illumination area of the exposure light and measures intensity at a plurality of points in the lateral direction, then moves one step in the longitudinal direction of the illumination area, and again scans in the lateral direction, the beam profile over the entire illumination area can be measured.

Figure 6:
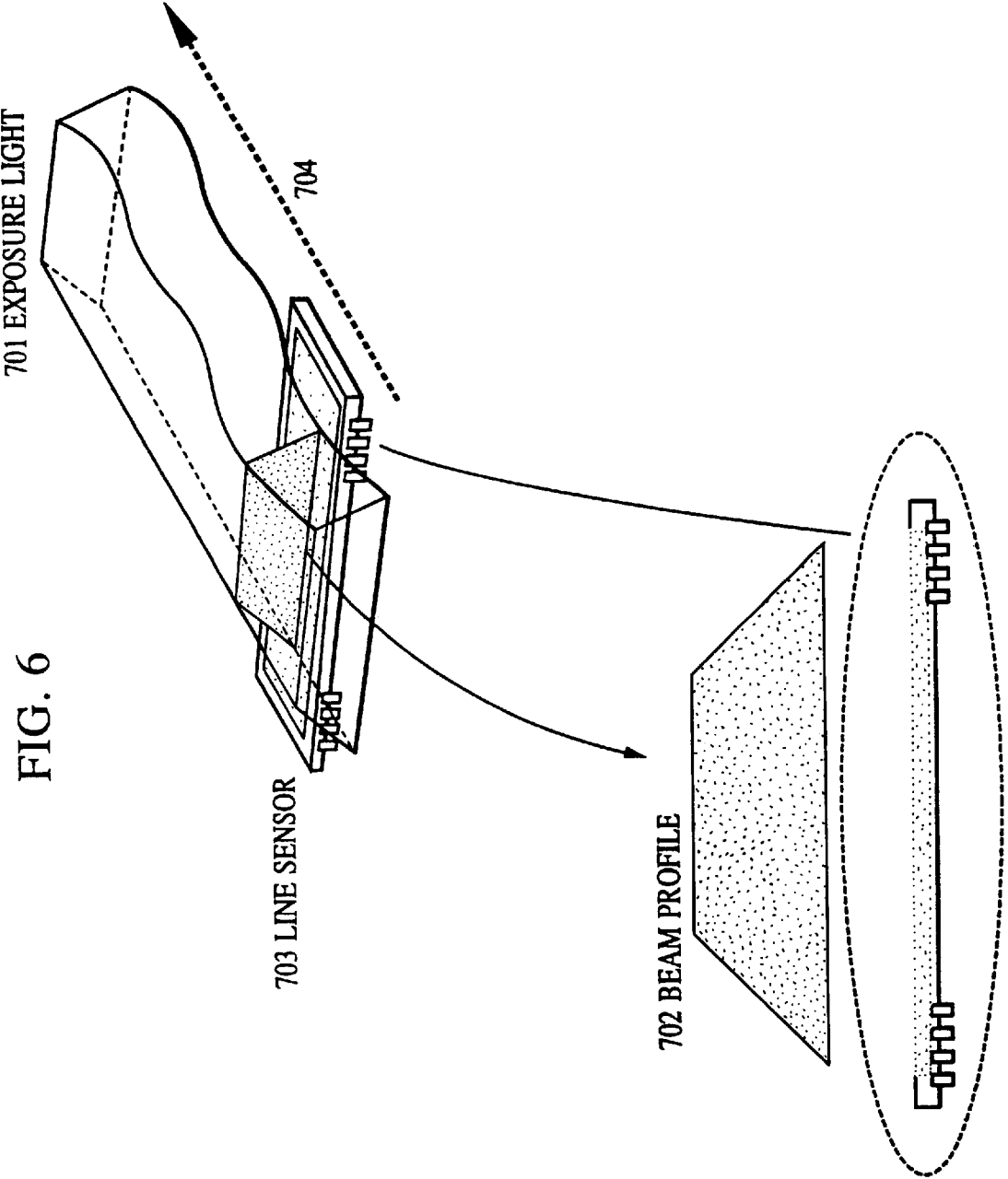
FIG. 6 illustrates a state of measurement of the beam intensity profile using a line sensor.

As shown in FIG. 6, when measuring a beam intensity profile of exposure light 701, a line sensor 703, such as a CCD, which is longer in a certain direction than the exposure light (lateral direction in FIG. 6), is used as the illuminance monitor B#15, whereby a beam profile 702 can be measured without scanning the wafer stage.

Thus, when the line sensor is used for measuring a beam profile, the beam profile of the exposure light can be measured by simply scanning the line sensor along the direction perpendicular to the direction in which the line sensor extends (the longitudinal direction of the illumination area in FIG. 6), so that processes of measuring the beam profile can be considerably simplified.

Figure 7:
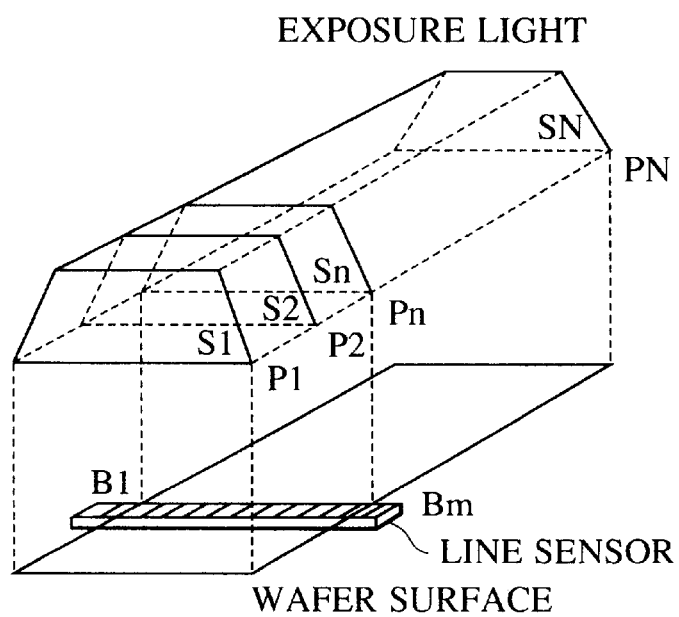
FIG. 7 illustrates a method of obtaining the sum of illuminance in the lateral direction of an illumination area.

In addition, when a line sensor covering the lateral direction of the illumination area is used for measuring the beam intensity profile, illuminance (S1 to SN) of the exposure light for each position (P1 to PN) in the longitudinal direction of the illumination area can be obtained from the sum total value of bits (the sum of output values b1 to bm of light receiving elements) output from light receiving elements (B1 to Bm) which constitute the line sensor, as shown in FIG. 7.

Figure 8:
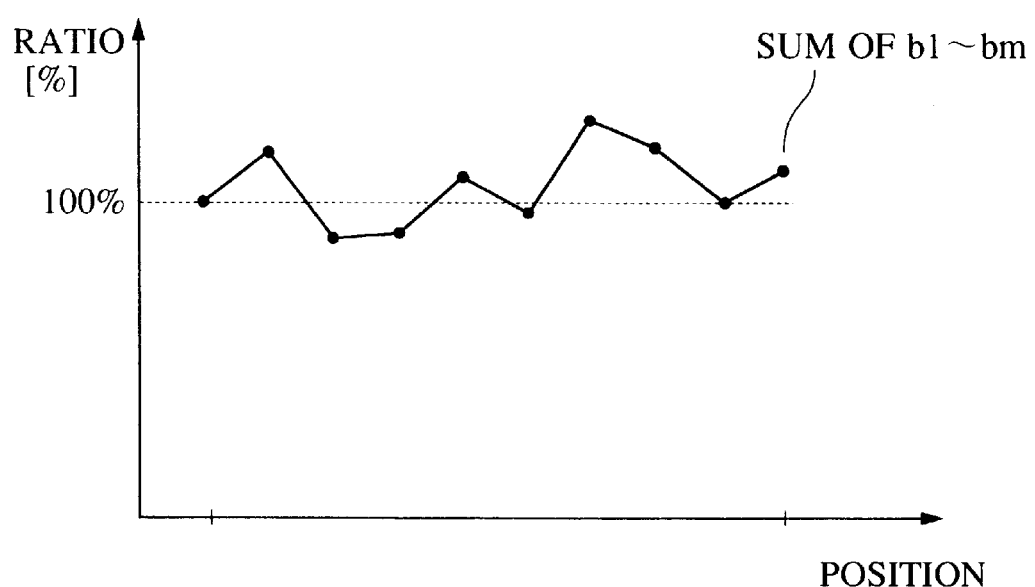
FIG. 8 illustrates an illuminance distribution in the longitudinal direction of the illumination area of a one-pulse exposure light.

Further, fluctuations in intensity of the exposure light can be canceled by normalizing the measured value at each position in the longitudinal direction of the illumination area with the output value of the illuminance monitor A#12, so that the illuminance distribution of a one-pulse exposure light shown in FIG. 8 in the longitudinal direction of the illumination area can be obtained.

It is generally known that, in scanning exposure apparatus, the exposure of a surface to be exposed is determined by the illuminance of the exposure light in the scanning direction. Therefore, when actually performing exposure, it is necessary to adjust the shape (width) of the illumination area so that the illuminance at each position in a direction perpendicular to the scanning direction (hereinafter, referred to simply as the non-scanning direction) is fixed.

Figure 9:
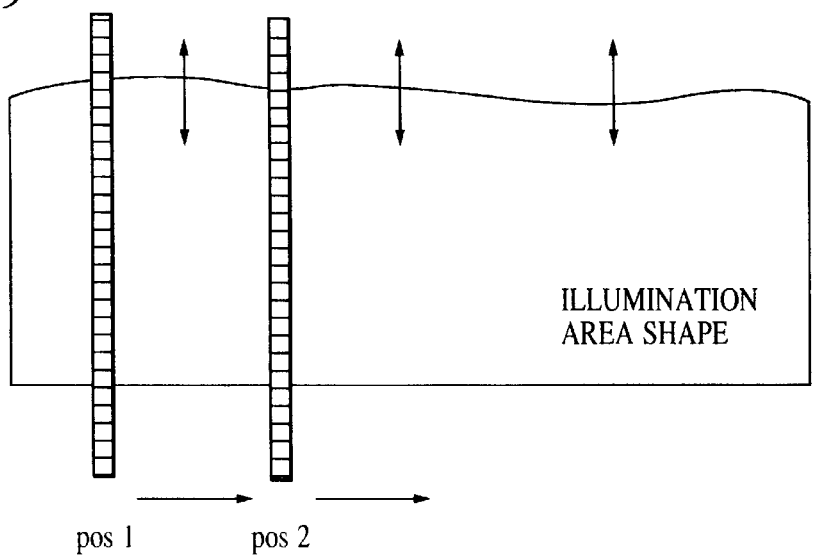
FIG. 9 illustrates the state of measurement of an illuminance distribution by moving the line sensor in a direction perpendicular to a scanning direction.
Figure 10:
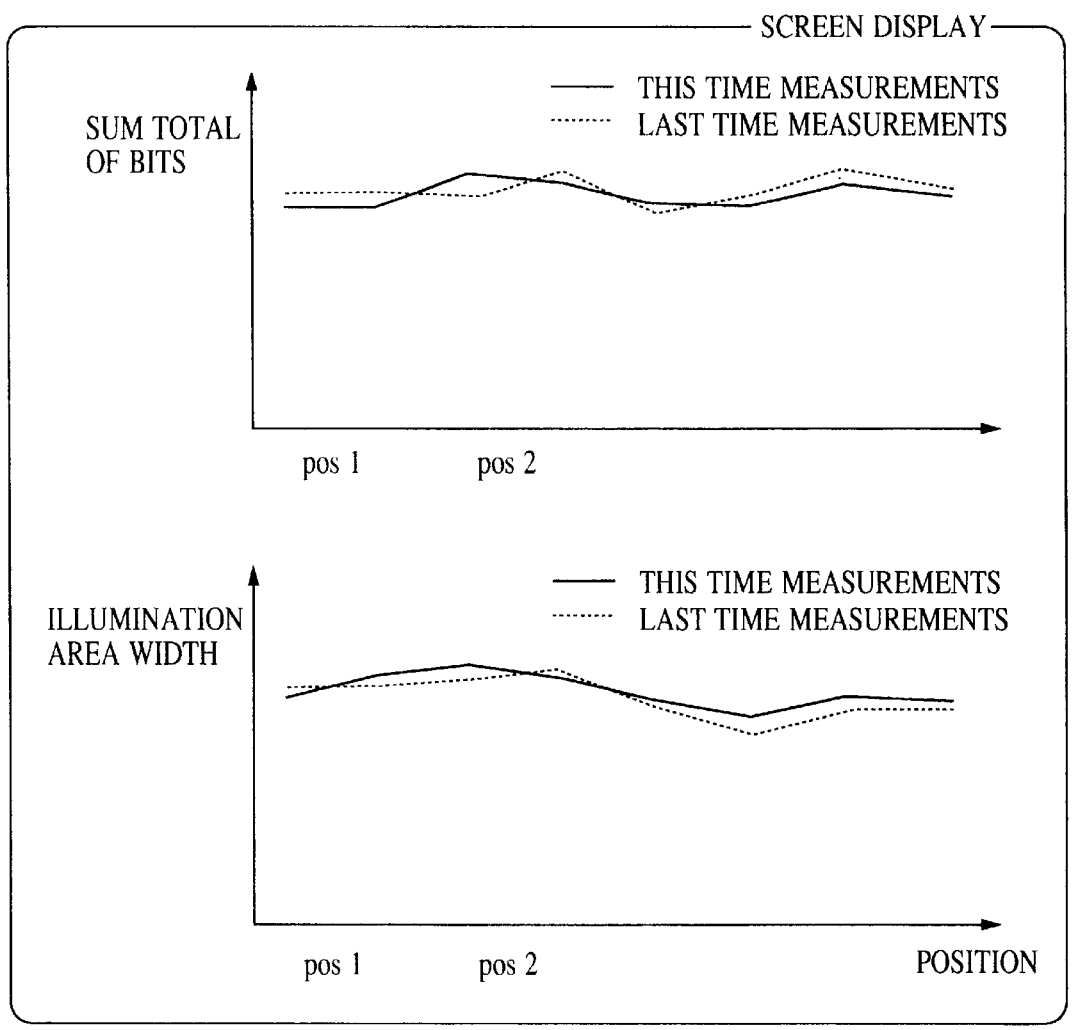
FIG. 10 illustrates an example of a display of the illuminance distribution measured in the manner as shown in FIG. 9.

FIG. 10 illustrates an example in which the sum total of bits in the non-scanning direction (corresponding to the illuminance in the scanning direction) and the width of the illumination area is displayed on the display section 106 when the illumination area has a shape as shown in FIG. 9. The width of the illumination area shown in the lower portion of FIG. 10 is obtained from the actual width of each light receiving element constituting a line sensor, by which an output of more than the predetermined threshold value can be obtained.

Figure 11:
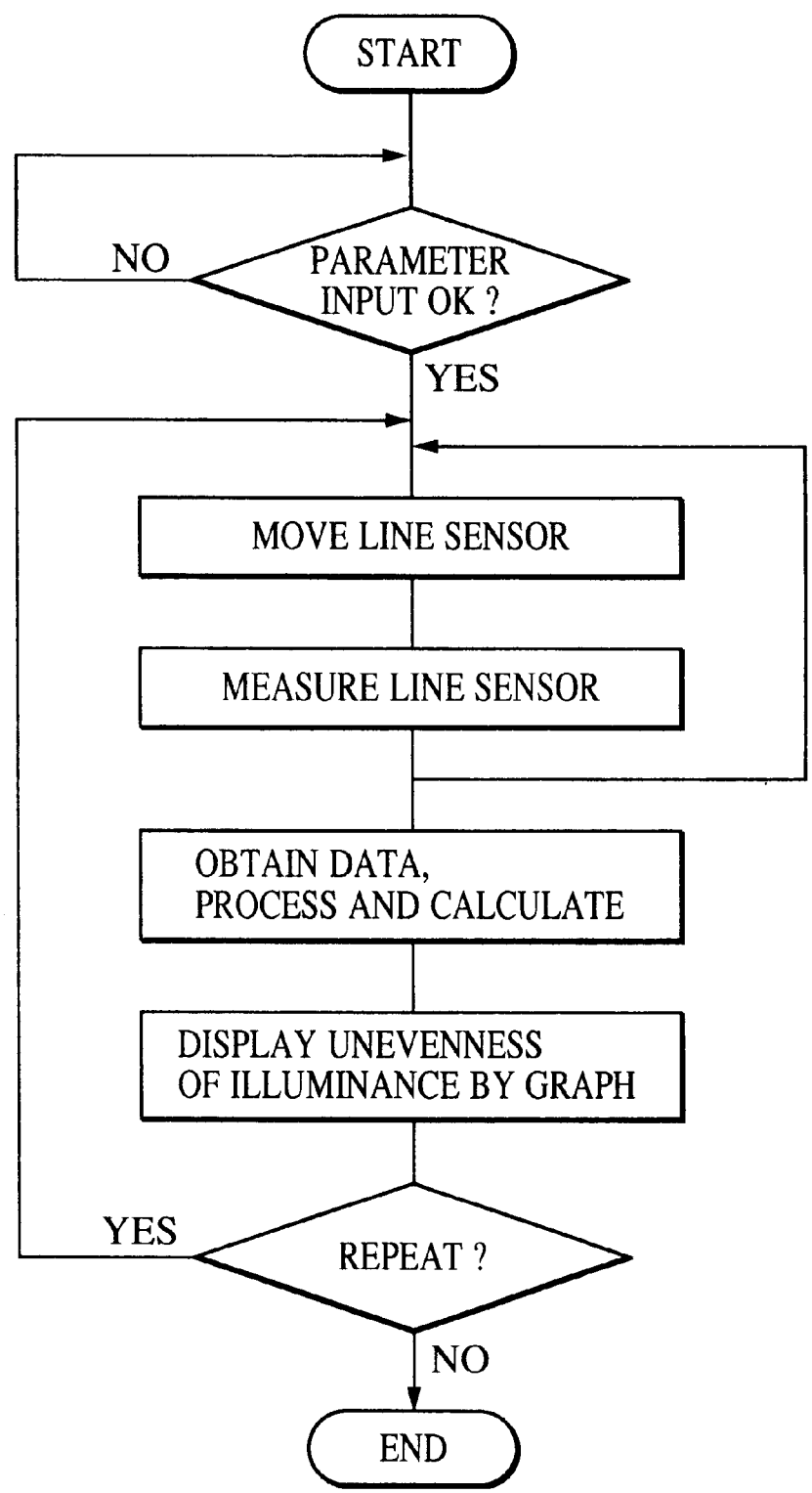
FIG. 11 is a flowchart showing the steps to adjust the shape of the illumination area utilizing the display shown in FIG. 10.

FIG. 11 is a flowchart showing the steps to adjust the width of the illumination area using the display shown in FIG. 10. The operator first inputs parameters, such as the number of measuring points in the non-scanning direction and the range of measurement. Other parameters to be inputted include coordinate positions measured by the line sensor, measuring pitch and the number of measurements. When the parameters are inputted, the line sensor is moved to a measurement position to perform a measurement. When the measurement of one section has been completed, the line sensor is moved stepwise to perform another measurement. When the measurements have been completed throughout the measurement area, data has been obtained to calculate the sum total of bits and the estimated shape of the illumination value, and the calculated results are displayed as shown in FIG. 10. The operator judges whether the illumination area has been adjusted to a predetermined shape based on the graphically displayed information. When the illumination area has not been adjusted to a predetermined shape, the operator adjusts the width of the movable slit 6 to assure a uniform illuminance distribution, and repeats the steps of measurement, calculation and display to adjust the shape of the illumination area. Alternatively, the apparatus itself may automatically adjust the width of the movable slit 6 and repeat the steps of measurement, calculation and display so that the calculated results are within the allowable range of a predetermined illuminance variation.

Figure 12:
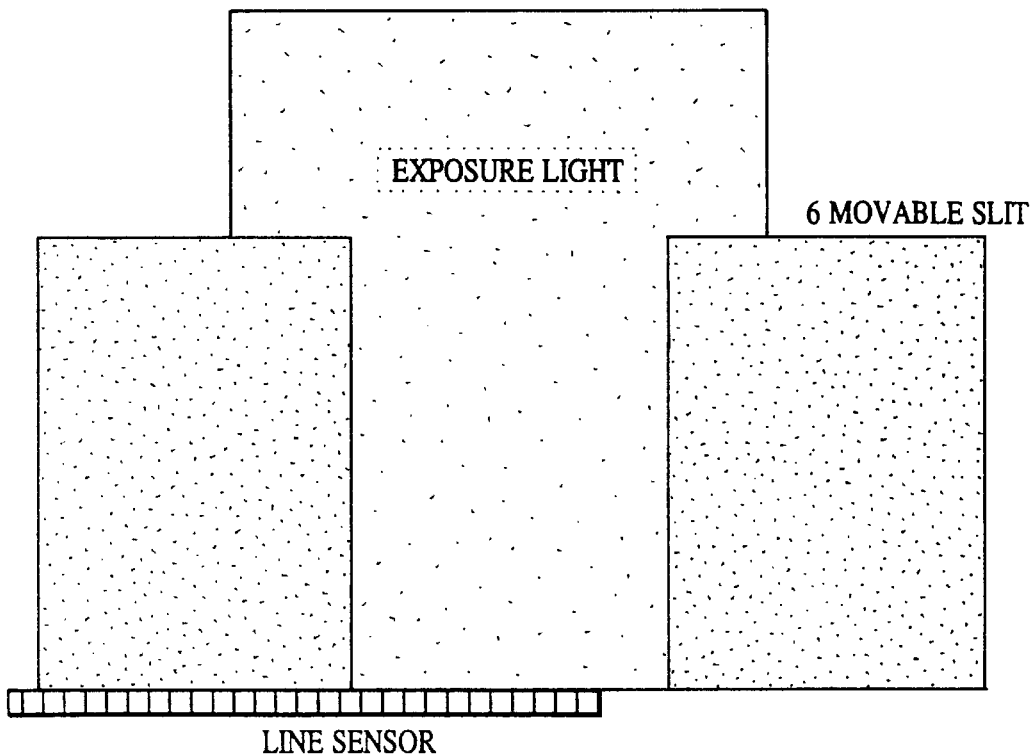
FIG. 12 illustrates a position of a movable slit in relation to the line sensor.
Figure 13:
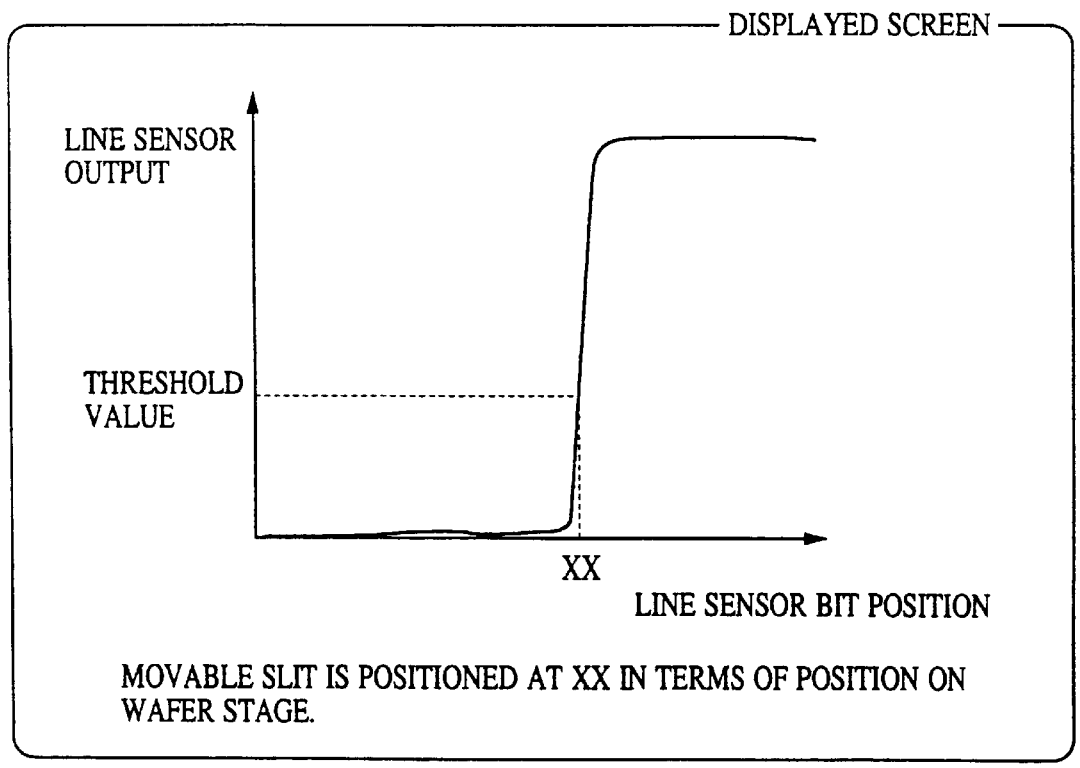
FIG. 13 illustrates an example of a display in the case of FIG. 12.

Accuracy in assembling the movable slit 6 can be measured by the same method as that of measuring the illuminance distribution. When the movable slit 6 is located in relation to the line sensor as shown in FIG. 12, the operator can easily adjust the position of the movable slit 6 by allowing the display section 106 to produce a screen display as shown in FIG. 13. When the position of the movable slit 6 is displayed, a threshold value is set in the output of the line sensor as in the case for measuring the width of the illumination area, and a position that exceeds the threshold value may be judged to be the position of the movable slit 6.

Figure 14A:
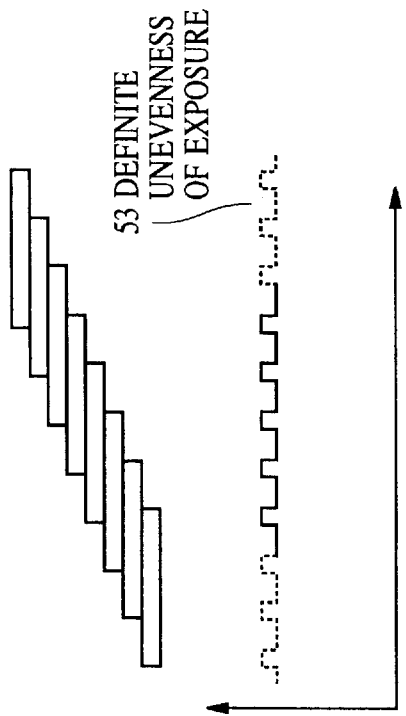
FIGS. 14A to 14C illustrate the exposure distribution at each exposure position in the scanning direction.
Figure 14B:
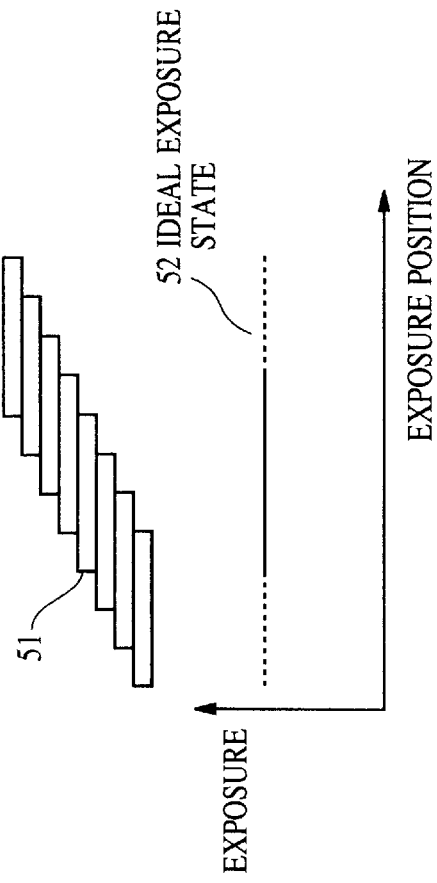
Figure 14C:
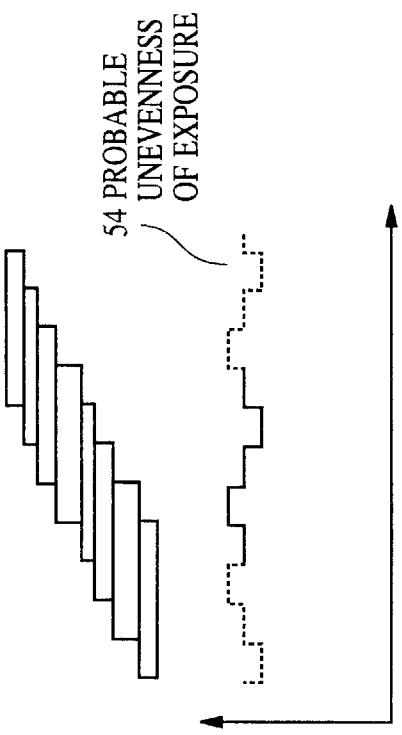

FIGS. 14A to 14C illustrate the exposure distribution at each exposure position in the scanning direction when the exposure is effected by a scanning exposure apparatus in which a pulsed light source is used. In these drawings, the horizontal axis represents the exposure position in the scanning direction, and the vertical axis represents the exposure. Reference numeral 51 denotes an exposure to an exposed surface provided by one pulse of pulsed light. If conditions such as the intensity profile of the pulsed light, the width in the scanning direction and the scanning speed are suitably provided, a uniform exposure can be obtained on the exposed surface as an ideal exposure state 52, as shown in FIG. 14A.

However, if any one of the above-described conditions is disturbed, unevenness of exposure shown by the graph 53 in FIG. 14B occurs, so that a uniform exposure cannot be obtained on the exposed surface. Since the unevenness of exposure can be predicted in advance, this condition is hereinafter referred to as a "definite unevenness of exposure".

In addition, while performing exposure, unevenness of exposure as shown by the graph 54 in FIG. 14C may be caused by the influence of variations in emission intensity of the pulsed light source and by fluctuations in the beam intensity profile, etc., without the presence of the above-described definite unevenness of exposure. The unevenness of exposure based on variations in emission intensity is hereinafter referred to as a "probable unevenness of exposure".

When a pulsed light source accompanied by intensity variations at each emission, such as an excimer laser, is used in the scanning exposure apparatus, not only is there definite unevenness of exposure, but also, probable unevenness of exposure becomes a problem in performing exposure. Thus, it is necessary to predict or measure the unevenness of exposure including the probable unevenness of exposure.

The exposure distribution can be obtained by calculation provided that the beam intensity profile of the measured exposure light, the stage scanning speed and the emission frequency of the light source are determined. In this embodiment, the CPU 201 within the main control system 104 performs the above calculation based on the given conditions.

FIGS. 15A and 15B each illustrates an example in which an error range of the exposure distribution in the scanning direction obtained by calculation is displayed on the display section 106. In these drawings, the solid lines represent the range of the exposure distribution including the definite unevenness of exposure alone, and the broken lines represent the range of the exposure distribution including the probable unevenness of exposure, in addition to the definite unevenness of exposure. The reason why the exposure distribution including the probable unevenness of exposure varies is that the exposure varies at each position in the non-scanning direction when the illuminance distribution in the scanning direction is not uniform.

FIGS. 15A and 15B show the calculated results under different exposure conditions. If the operator is not satisfied with the calculated results displayed as shown in FIG. 15A, the operator can newly input the exposure condition to allow the CPU 201 to calculate again, so as to obtain the calculated results as shown in FIG. 15B. Of course, the apparatus itself may automatically change the exposure condition to allow the CPU 201 to calculate again and to allow the display section 106 to display the final results alone so that the calculated results fall within the predetermined range.

Figure 16:
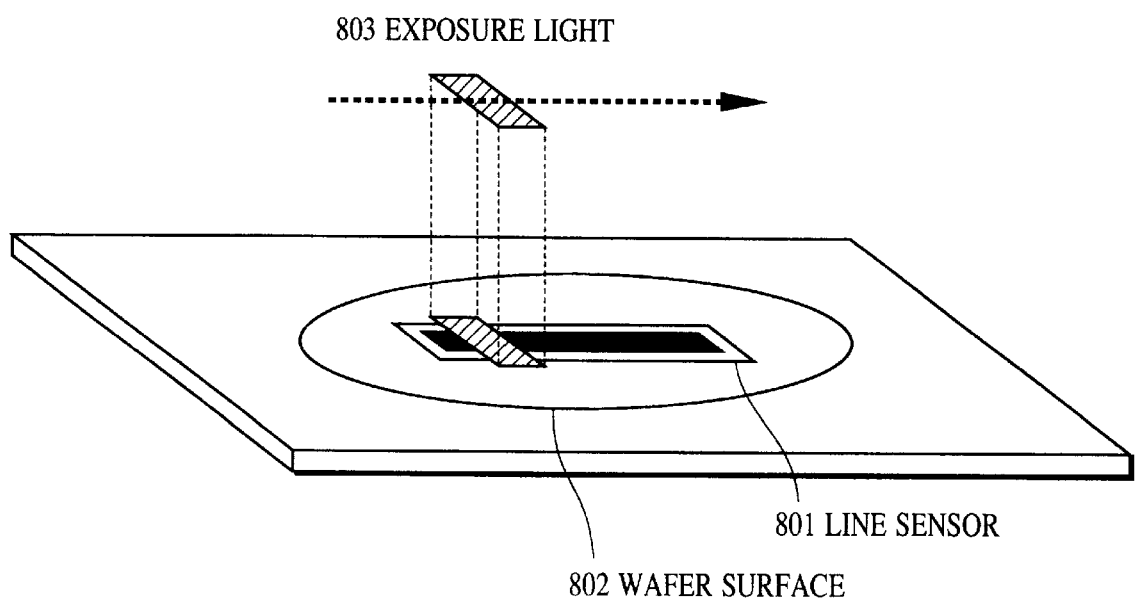
FIG. 16 illustrates a construction of an apparatus by which the line sensor is exposed under the same conditions as those of the actual exposure.

An embodiment will now be described in which a line sensor, such as a CCD, for covering a one-shot exposure area is arranged on the wafer stage 14, and the line sensor measures under the same conditions as those of the actual exposure, and the measured results are displayed on the display section 106. FIG. 16 illustrates this arrangement.

A line sensor 801 is provided on a wafer surface 802 so that the longitudinal direction of the line sensor 801 coincides with the scanning direction. The line sensor 801 is actually exposed by being illuminated with exposure light 803 while being scanned under the same conditions as those of the actual exposure. At this time, the exposure, including the definite unevenness of exposure and the probable unevenness of exposure, is provided to the line sensor 801, so that exposure distribution of one line in the scanning direction can be measured. In order to measure the exposure distribution of the entire one-shot exposure area, the above processes may be preferably performed in each position in the non-scanning direction. However, if only one line is measured, the exposure distribution of the entire exposure area can be predicted from the previously obtained intensity profile of the exposure light.

In addition, a method may be employed in which the longitudinal direction of the line sensor is allowed to coincide with the non-scanning direction to expose the line sensor, and, after completion of the exposure, the line sensor is moved in the scanning direction to measure the exposure distribution at another position.

Further, a method may be employed in which the longitudinal direction of the line sensor is allowed to coincide with the scanning direction to measure one to several lines, and the longitudinal direction of the line sensor is allowed to coincide with the non-scanning direction to measure one to several lines, and then the exposure distribution is calculated from both measured results.

Still further, if some exposure control is made in the exposure process, the results of the exposure control can be evaluated. The control parameters, such as the scanning speed during the exposure and the emission frequency of the light source, are evaluated from the calculated results, so that parameter adjustment can be performed to provide a desired exposure accuracy. In addition, as in the case of FIGS. 15A and 15B, the exposure distribution revealed by the measurement may be displayed on the display section 106 so that the operator can use it when selecting the control parameters.

Figure 17:
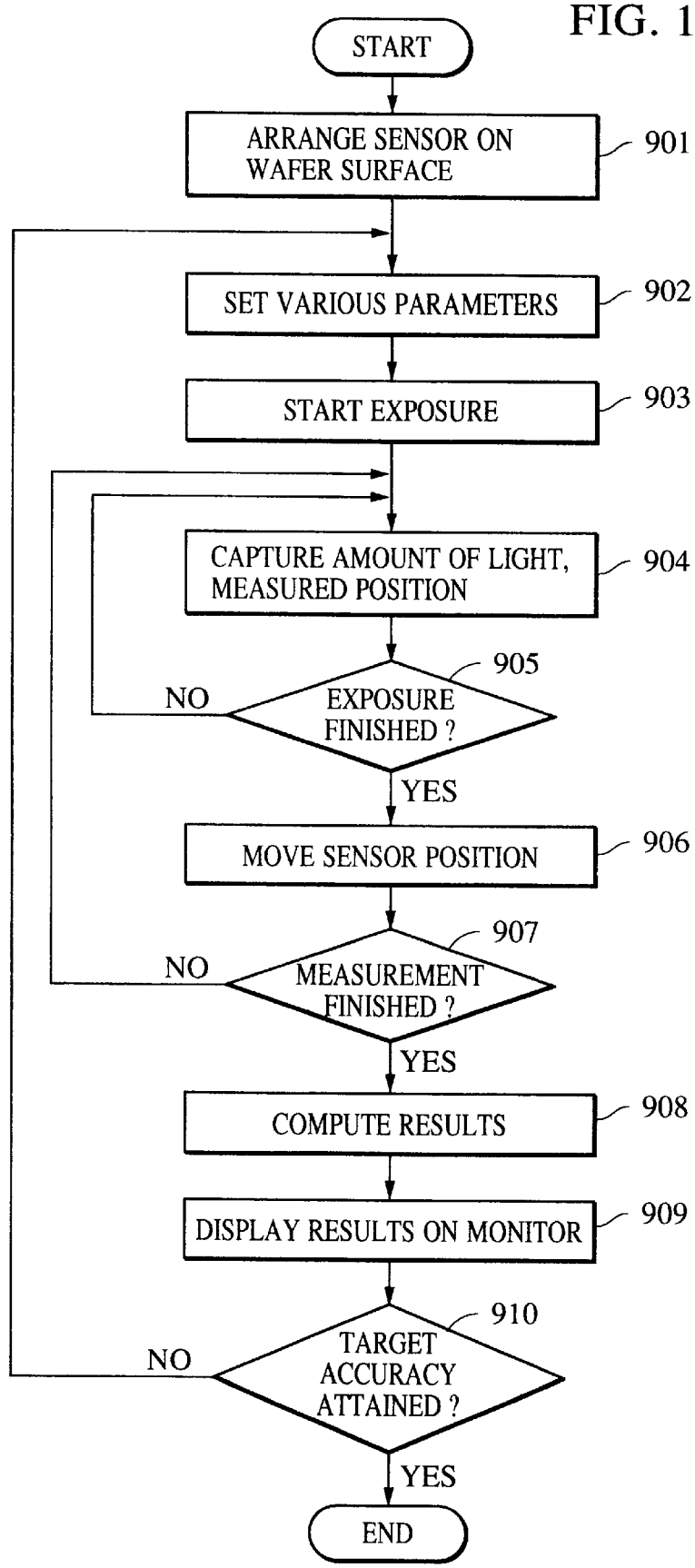
FIG. 17 is a flowchart showing the steps of exposing the line sensor under the same conditions as those of the actual exposure.

FIG. 17 is a flowchart showing the steps of exposing the line sensor in order to measure the exposure distribution.

In step 901, a sensor is arranged on a wafer surface. The control parameters, such as the emission frequency of the light source and the scanning speed, are designated in step 902, and the stage is scanned to actually expose the line sensor in step 903. The measured results of the line sensor and the measurement positions are captured in step 904, and the value of each bit is integrated sequentially by the measured results.

In step 905, whether the exposure of the line sensor has been completed is judged. When the exposure of the line sensor has not yet been completed, the procedure returns to step 904 to continue measuring. When the measurement has been completed throughout the line sensor, the position of the line sensor is moved in step 906. Whether the measurement of the entire exposure area has been completed is judged in step 907. If not completed, the procedure returns to step 904 to perform the measurement again. If completed, the measured results are statistically calculated (i.e., the unevenness of exposure in the exposure surface, the maximum exposure and the minimum exposure are calculated).

In step 909, the calculated results are displayed on a monitor, and whether the results satisfy the conditions, such as a target in-plane exposure accuracy and the maximum and minimum exposure, are judged in step 910. When the conditions are not satisfied, the control parameters, such as the emission frequency and the scanning speed, are changed and the procedure returns to step 902 to perform the same processes. By repeating these processes, various control parameters can be set to suitable values for obtaining the desired exposure accuracy.

The operator may provide the apparatus with a desired value of the exposure accuracy in advance, so that the apparatus itself changes the exposure condition to decide the control parameter by trial and error.

In calculating the exposure distribution, when the emission intensity of the light source is stable (including a case in which the emission intensity is not in a transient state and the control parameter of the light source is not changed), and accuracy is not required so much, once the exposure distribution within the wafer surface is calculated, the exposure distribution on the wafer surface can be calculated easily from the scanning speed of the stage and the emission frequency of the light source.

Figure 18:
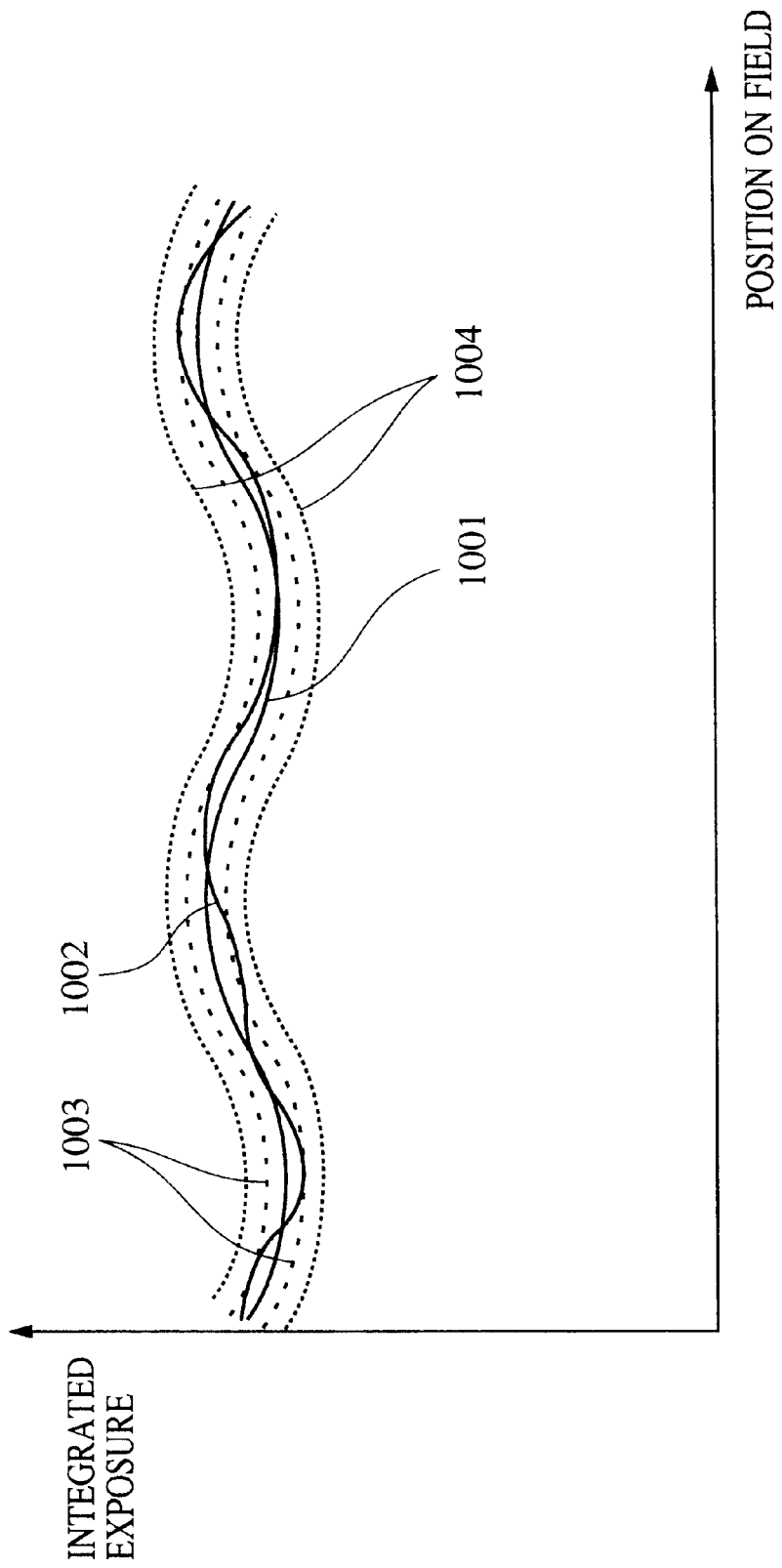
FIG. 18 illustrates curved lines representing the actually measured exposure distribution in the scanning direction and $3\sigma$ thereof.

FIG. 18 is a graph which illustrates the exposure distribution at each exposure position in the scanning direction in accordance with the concepts of the above method. Referring to FIG. 18, the difference between the exposure distribution 1001 expected from the previously calculated intensity profile of the exposure light at a certain line and the exposure distribution 1002 obtained from the actual exposure under a certain condition at each corresponding position is obtained, and a standard deviation σ1 of the difference is calculated.

When the standard deviation σ1 is obtained, a curve 1003 satisfying 3σ of the exposure distribution can be drawn. When the scanning speed and the emission frequency of the light source are changed and the number of pulses received by one point of the exposure surface is changed from N1 to N2, a change in the standard deviation is represented by the following equation:

$$\sigma 2 = \sigma 1 \times \sqrt{N2/N1}$$

Therefore, the value of 3σ of the unevenness of exposure within the wafer surface obtained by changing the scanning speed and the emission frequency changes from a curve 1003 to a curve 1004, and the maximum and the minimum values of the exposure together with the value of 3σ are examined, so that the stage scanning speed and the emission frequency of the light source can be adjusted.

According to the present invention, the sensor is scanned relative to the pulsed light using the above-described apparatus so as to detect the intensity of the pulsed light at each position, whereby the beam intensity profile of the pulsed light in the longitudinal and lateral directions of the slit is determined, so that exposure conditions, such as the scanning speed and the emission frequency of the pulsed light are determined in advance from the detected results and the required exposure accuracy.

According to the present invention, when the sum of the illuminance of lines in the scanning direction is not uniform in a direction perpendicular to the scanning direction, the scanning speed capable of realizing the required exposure accuracy and the emission frequency of the pulsed light can be determined in advance by taking into account the definite unevenness of exposure which occurs when the width of the illumination area is changed, whereby an exposure process of high accuracy can be effected.

In addition, the exposure distribution including the probable unevenness of exposure within the wafer surface in which variations in the emission intensity of the pulsed light are included can be calculated without actually exposing the wafer, whereby the scanning speed for realizing the required exposure accuracy and the emission frequency can be determined using the calculated results.

Further, the measured results of the beam intensity profile, the expected exposure distribution and the values of various parameters can be observed and confirmed by the display section, and varied by the input section.

The exposure apparatus of this embodiment can also provide the operator with information, such as which area of the wafer is exposed during the actual exposure and whether or not a pattern printing of the shot which is being exposed or already exposed has been effected with high accuracy.

Figure 19:
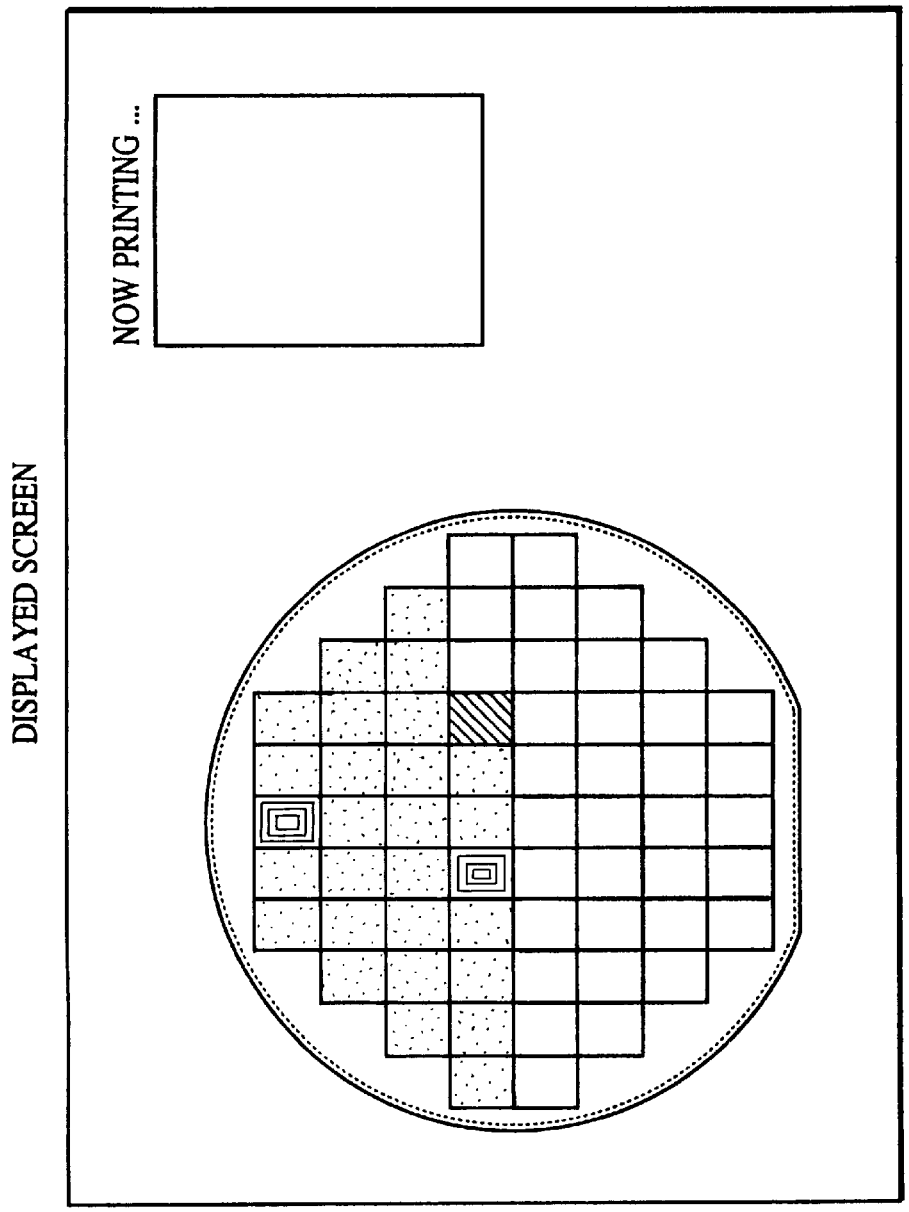
FIG. 19 illustrates an example in which the actual exposure is displayed.

FIG. 19 illustrates an example in which such information is displayed on the display section 106. A general view of the wafer is displayed on the left-hand side of the displayed screen. Small rectangular areas in the general views of the wafer represent one-shot exposure areas, dotted areas represent the shots which have already been exposed, a diagonally shaded area represents the shot which is now being exposed, and the solidly shaded areas represent error shots, respectively. In this embodiment, the exposure is now being effected by repeating step-and-scan exposure from the upper-left portion to the lower-right portion of the displayed screen.

At the upper-right portion of the screen, there is displayed an enlarged view of the shot now being exposed. Although the kind of display is specifically described later, the operator can learn a state of the shot now being exposed in more detail by the display made on this section. In addition, the operator can instruct the apparatus by the input section 105 to display on this section an enlarged view of the shots which have already been exposed. Various other information can be displayed by the instruction of the operator.

The exposure apparatus of this embodiment calculates the light intensity of the exposure light with the illuminance monitor A#12 during the actual exposure and obtains the exposure of the wafer. A specific method will now be described in which whether a pattern printing of each shot is precisely performed is judged during the actual exposure based on the values obtained by the illuminance monitor A#12, and the judged results are displayed on the display section 106.

During the actual exposure, the CPU 201 within the main control system 104 calculates the relation between the definite unevenness of exposure α, the allowable unevenness of exposure β, and the emission error γ derived from the measured value of the illuminance monitor A#12. The relation can be represented by the following inequality:

$$\gamma/\sqrt{a} < \sqrt{\beta^2 - \alpha^2}$$

where a is the number of pulses of a certain point of the exposure area represented by the following equation:

$$a = F \times L / v$$

where F is an emission frequency, L is a width of the illumination area in the scanning direction, and v is a scanning speed. The value of α is obtained by calculation of the above-described method from the measured beam intensity profile, emission frequency and scanning speed, and the value of β is set by the operator.

Figure 20:
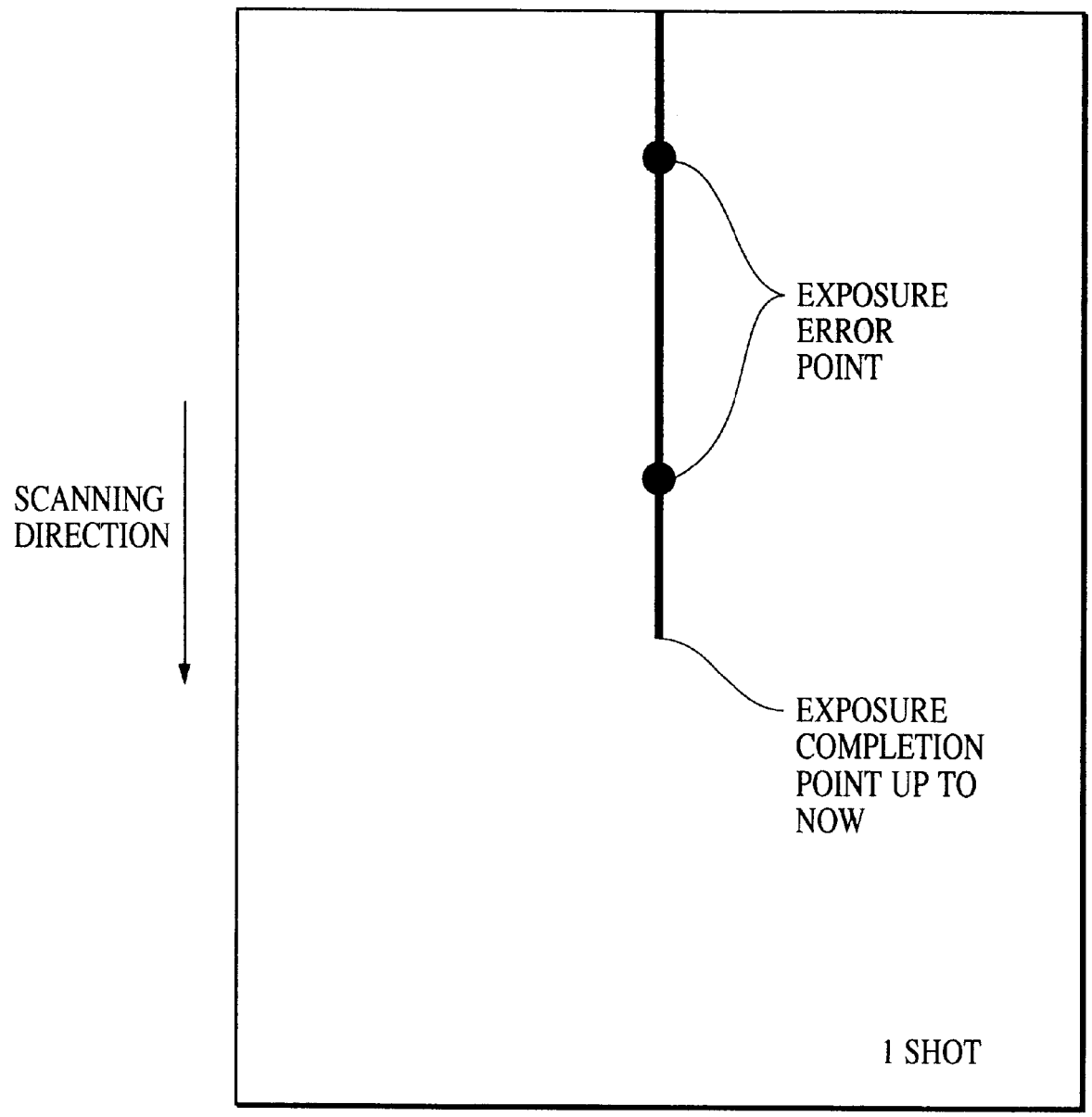
FIG. 20 illustrates an example of an enlarged display of a shot during the exposure.

When the condition represented by the above inequality does not hold, the CPU 201 judges the occurrence of an exposure error, and allows the display section 106 to produce a screen display as shown in FIG. 20 in real time. Referring to FIG. 20, the exposed section is represented by an extending solid line, and black dots on the solid line are sections where an occurrence of the exposure error decided by the above-described conditional inequality is judged.

Figure 21:
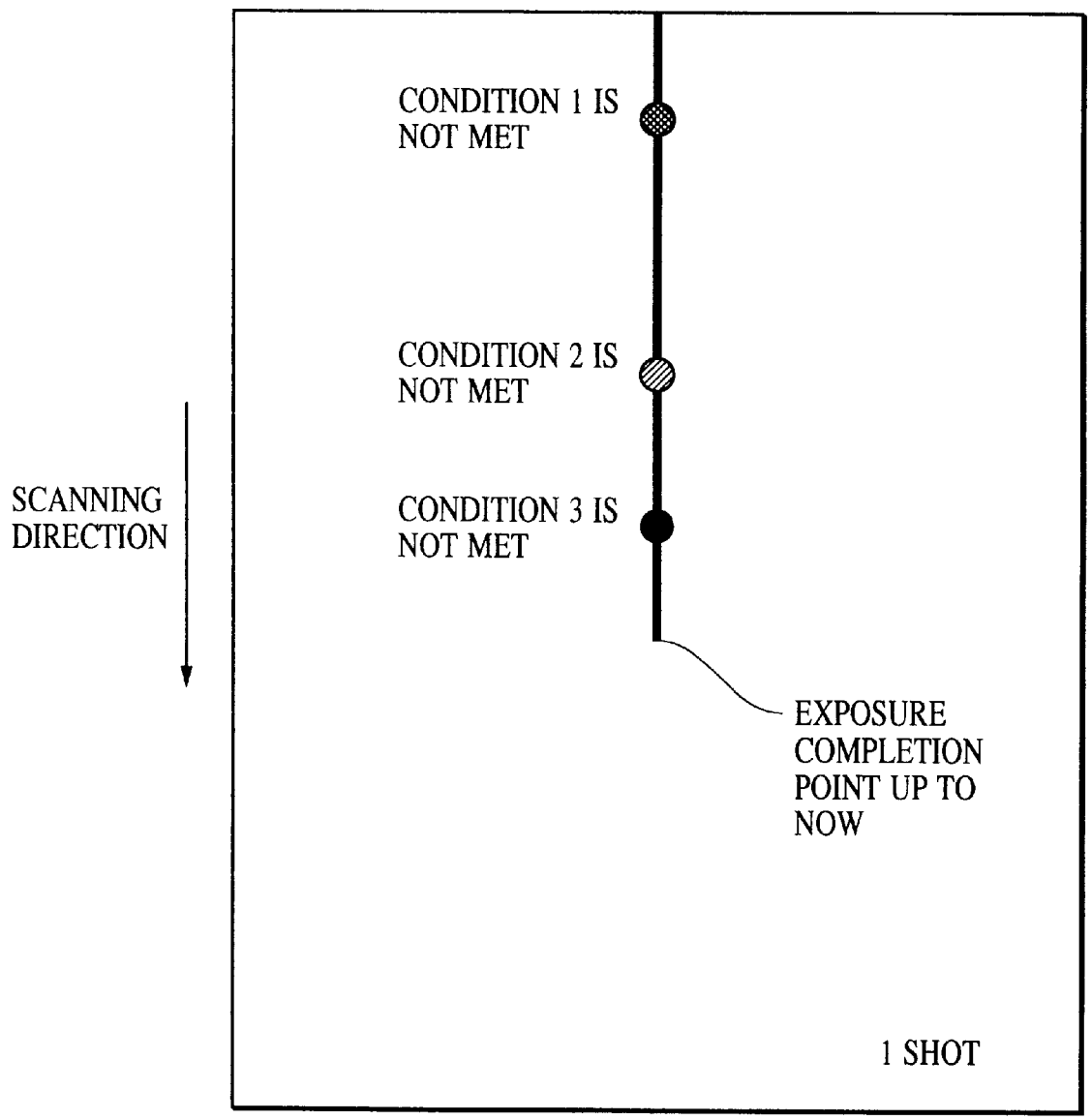
FIG. 21 illustrates another example of an enlarged display of the shot during the exposure.
Figure 22:
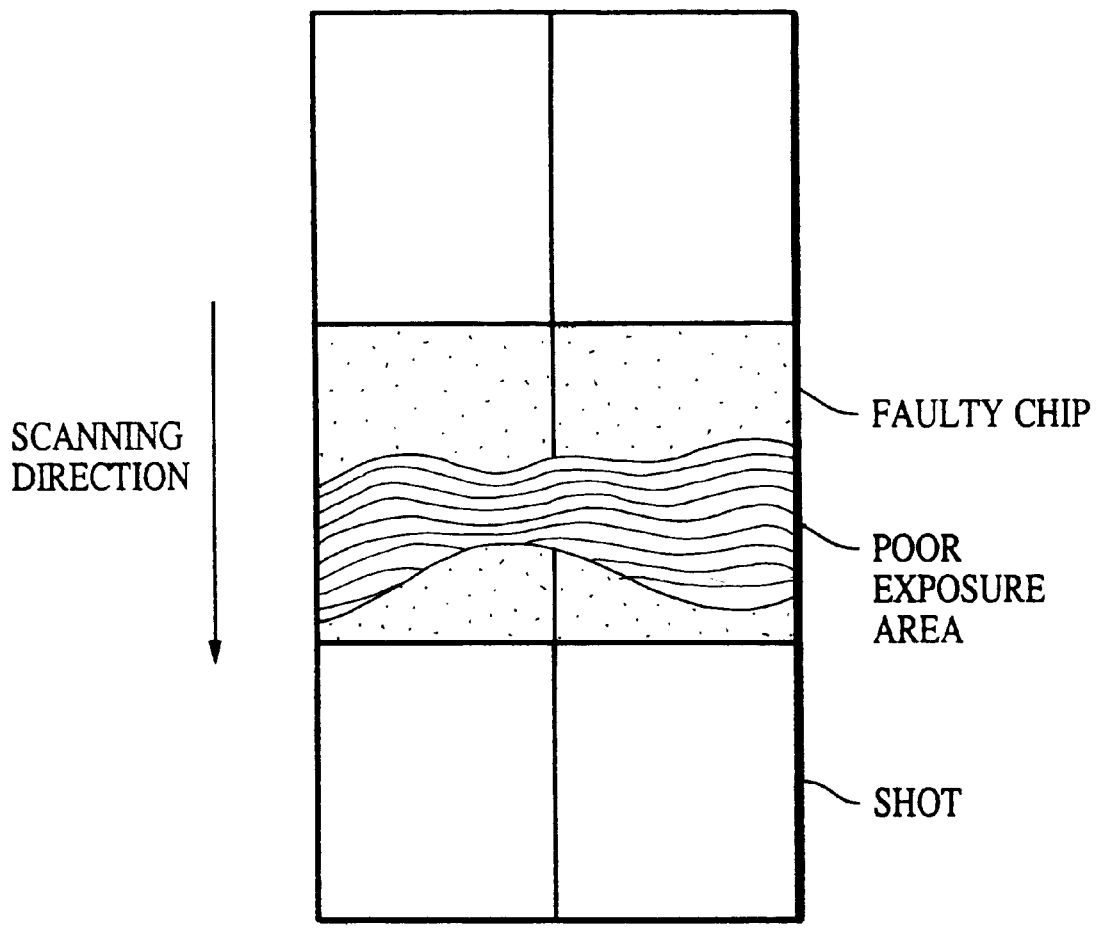
FIG. 22 illustrates a further example of an enlarged display of the shot during the exposure.

An example may be considered in which a plurality of values (conditions) are set to the allowable unevenness of exposure β, and unsatisfied conditions are color-coded as shown in FIG. 21. In addition, when a plurality of chips are exposed in a one-shot exposure area, normal chips and faulty chips may be mixed within the one-shot exposure area. FIG. 22 illustrates an example in which such a one-shot exposure is displayed so that the faulty chips can be recognized at a glance.

In the above-described examples, the simulated information regarding the progress of the exposure is displayed on the screen corresponding to the actual exposure. However, when the calculation takes too much time to display the information, the calculation may be collectively performed after the completion of the exposure, and then, the information may be displayed.

Figure 23:
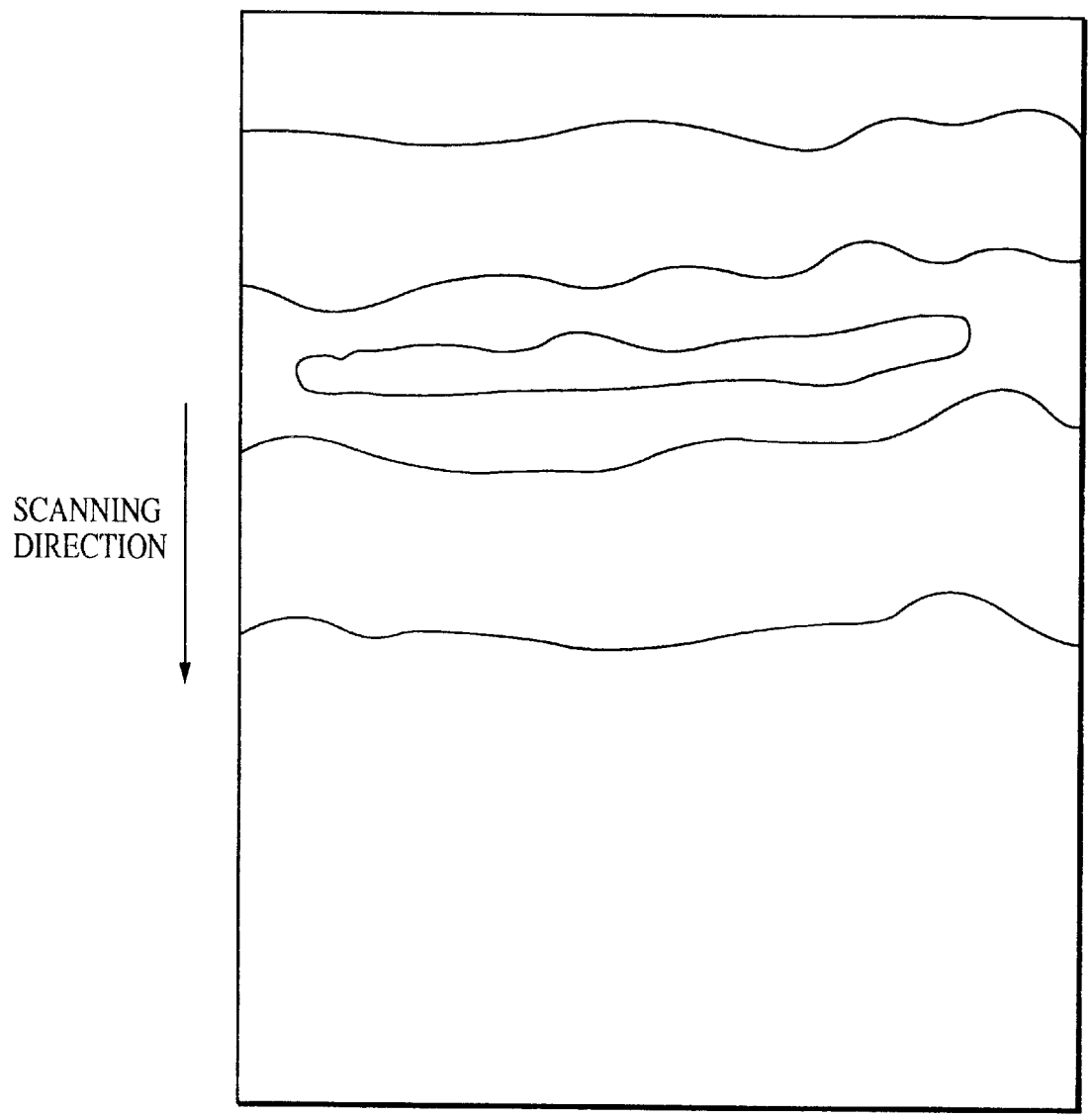
FIG. 23 illustrates still a further example of an enlarged display of the shot during the exposure.

In addition, a display pattern of the exposure is not limited to the above-described patterns. For example, as shown in FIG. 23, the exposure may be displayed by contour lines and by color variation (not shown).

Further, the data such as error shots and faulty chips may be outputted to a manufacturing apparatus for other processes, as well as being displayed on the screen. An apparatus which has received the data, such as an exposure apparatus for exposing other layers, provides a process such that the error shots are not exposed, whereby devices can be efficiently manufactured.

An embodiment of a method of manufacturing devices utilizing the above-described scanning exposure apparatus of FIG. 1 will now be described.

Figure 24:
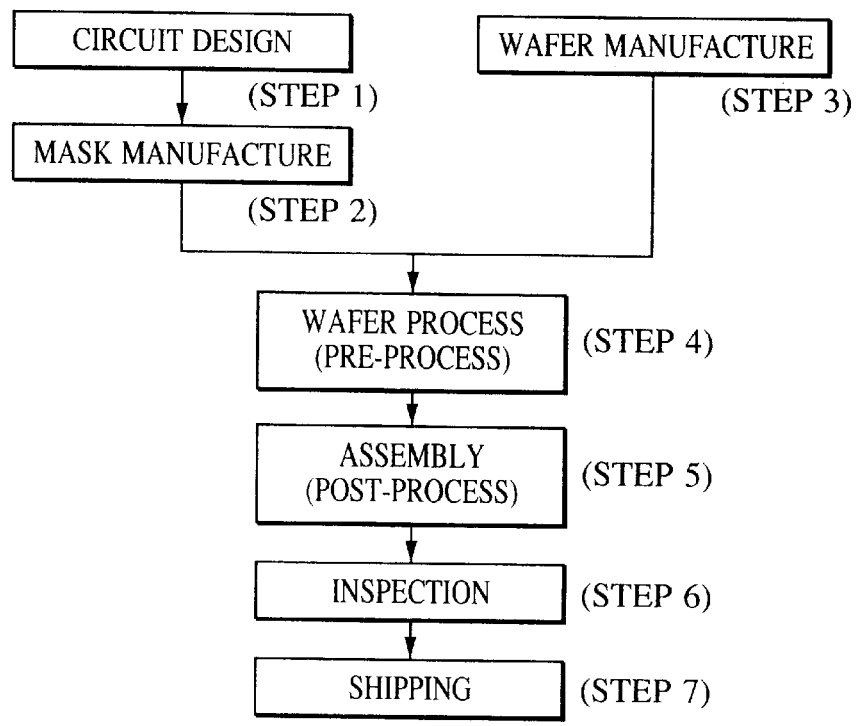
FIG. 24 is a flowchart showing the steps in a process of manufacturing semiconductor devices.

FIG. 24 is a flowchart showing the steps in a method of manufacturing semiconductor devices (such as a semiconductor chip for an IC and an LSI, a liquid crystal panel, and a CCD and the like).

In step 1 (circuit design), a circuit for the semiconductor device is designed. In step 2 (mask manufacture), a mask (reticle 9) on which the designed circuit pattern is formed is manufactured. On the other hand, in step 3 (wafer manufacture), a wafer (wafer 11) is manufactured using a material such as a silicon. Step 4 (wafer process) is called a pre-process in which the circuit is actually formed on the wafer by lithographic technology using the above prepared mask and wafer.

The next step 5 (assembly) is called a post-process which is a process for transforming devices into chips using the wafer manufactured in step 4, and which includes processes such as an assembly process (dicing and bonding), and a packaging process (chip sealing). In step 6 (inspection), an operation verification test and a durability test of the semiconductor devices manufactured in step 5 are conducted. The semiconductor devices are completed through these processes, and the completed semiconductor devices are shipped (step 7).

Figure 25:
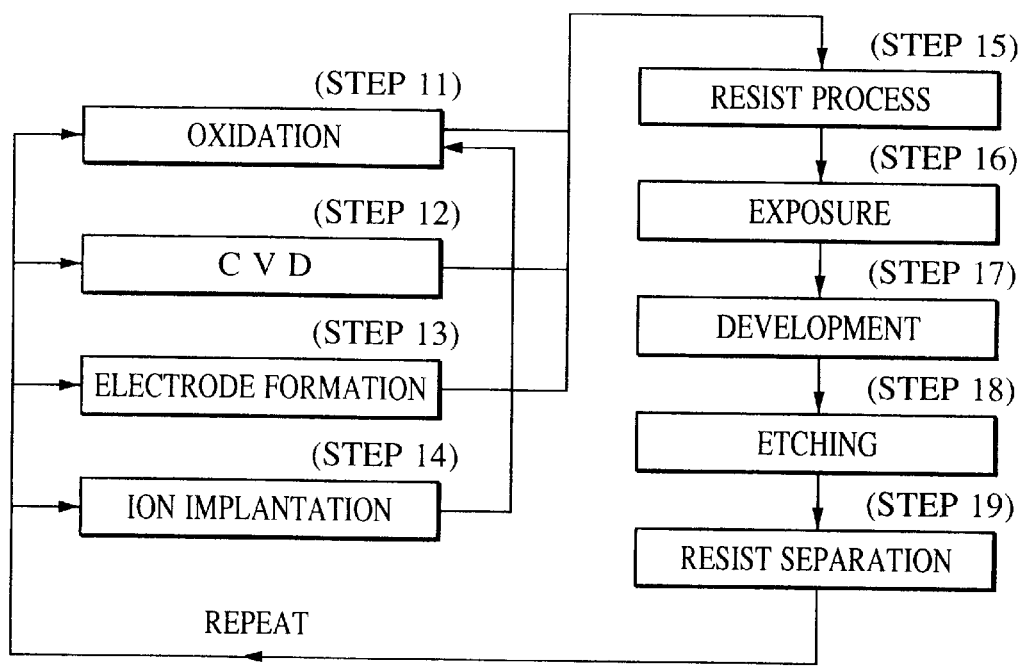
FIG. 25 is a flowchart showing detailed steps of a wafer process in the processes of FIG. 24.

FIG. 25 is a flowchart showing detailed steps of the above-described wafer process. In step 11 (oxidation), the surface of the wafer (wafer 11) is oxidized. In step 12 (CVD), an insulating film is formed on the surface of the wafer. In step 13 (electrode formation), electrodes are formed on the wafer by evaporation. In step 14 (ion implantation), ions are implanted into the wafer. In step 15 (resist process), a resist (sensitive agent) is applied to the wafer. In step 16 (exposure), the wafer is exposed with an image of the circuit pattern of the mask (reticle 9) by the above-described exposure apparatus. In step 17 (development), the exposed wafer is developed. In step 18 (etching), a portion other than the developed resist is etched away. In step 19 (resist separation), etched and unnecessary resist is removed. By repeatedly performing these steps, circuit patterns are formed on the wafer.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus, comprising:

mask scanning means for scanning a mask on which a pattern is formed;

a projection optical system for projecting the pattern on the mask onto a wafer;

wafer scanning means for scanning the wafer, onto which the pattern is projected by said projection optical system;

illuminating means for sequentially illuminating the mask in an illumination area narrower than the pattern by synchronously scanning the mask and the wafer relative to each other using said mask scanning means and said wafer scanning means, so as to expose and transfer the mask pattern onto the wafer;

monitor means for monitoring a state of the transfer of the mask pattern during exposing and transferring of the pattern onto the wafer and for obtaining monitoring information;

error detection means for detecting errors in the pattern transfer based on the monitoring information obtained by said monitor means and for producing error detection results; and output means for outputting information regarding the error detection results produced by said error detection means.

2. An exposure apparatus according to claim 1, wherein the error detection results include errors related to the exposure.

3. An exposure apparatus according to claim 1, wherein the errors related to the exposure include information showing error shots on the wafer.

4. An exposure apparatus according to claim 1, wherein the errors related to the exposure include information showing error chips contained within a one-shot exposure area on the wafer.

5. An exposure apparatus according to claim 1, further comprising display means for displaying the information regarding the error detection results produced by said error detection means and output by said output means.

6. An exposure apparatus according to claim 1, further comprising a light source which supplies pulsed light accompanied by energy variations at each emission of the pulsed light.

7. An exposure apparatus according to claim 6, wherein said light source comprises an excimer laser.

8. An exposure apparatus, comprising:

mask scanning means for scanning a mask on which a pattern is formed;

a projection optical system for projecting the pattern on the mask onto a wafer;

wafer scanning means for scanning the wafer, onto which the pattern is projected by said projection optical system;

illuminating means for illuminating the mask in an illumination area narrower than the pattern by synchronously scanning the mask and the wafer relative to each other using said mask scanning means and said wafer scanning means, so as to expose and transfer the mask pattern onto the wafer;

monitor means for monitoring a state of the transfer of the mask pattern during exposing and transferring of the pattern onto the wafer and for obtaining exposure information; and display means for displaying the exposure information obtained by said monitor means.

9. An exposure apparatus according to claim 8, wherein said monitor means comprises an exposure measurement means for measuring an amount of exposure received by the wafer.

10. An exposure apparatus according to claim 8, further comprising a light source which supplies pulsed light accompanied by energy variations at each emission of the pulsed light.

11. An exposure apparatus according to claim 10, wherein said light source comprises an excimer laser.

12. A method of manufacturing a semiconductor device, comprising the steps of:

scanning a mask on which a pattern is formed, using a mask scanning device;

projecting the pattern on the mask onto a wafer, using a projection optical system;

scanning the wafer, onto which the pattern is projected by the projection optical system, using a wafer scanning device;

sequentially illuminating the mask in an illumination area narrower than the pattern by synchronously scanning the mask and the wafer relative to each other, using the mask scanning device and the wafer scanning device, so as to expose and transfer the mask pattern onto the wafer to manufacture a semiconductor device;

monitoring a state of the transfer of the mask pattern during exposing and transferring of the mask pattern onto the wafer and obtaining monitoring information;

detecting errors in the pattern transfer based on the monitoring information obtained in said monitoring step and producing error detection results; and outputting information regarding the error detection results in said error detection step.

13. A method of manufacturing a semiconductor device according to claim 12, wherein the error detection results include errors related to the exposure.

14. A method of manufacturing a semiconductor device according to claim 12, wherein the errors related to the exposure include information showing error shots on the wafer.

15. A method of manufacturing a semiconductor device according to claim 12, wherein the errors related to the exposure include information showing error chips within a one-shot exposure area on the wafer.

16. A method of manufacturing a semiconductor device according to claim 12, further comprising displaying the errors related to the exposure on a display.

17. A method of manufacturing a semiconductor device, comprising the steps of:

scanning a mask on which a pattern is formed, using a mask scanning device;

projecting the pattern on the mask onto a wafer, using a projection optical system;

scanning the wafer, onto which the pattern is projected by the projection optical system, using a wafer scanning device;

sequentially illuminating the mask in an illumination area narrower than the pattern by synchronously scanning the mask and the wafer relative to each other, using the mask scanning device and the wafer scanning device, so as to expose and transfer the mask pattern onto the wafer to manufacture a semiconductor device;

monitoring a state of the transfer of the mask pattern during exposing and transferring of the pattern onto the wafer and obtaining exposure information; and displaying the exposure information obtained in said monitoring step.

18. A method of manufacturing a semiconductor device according to claim 17, wherein said monitoring step comprises measuring an amount of exposure received by the wafer.

19. An exposure apparatus, comprising:

a projection optical system for projecting a pattern on a mask onto a wafer;

scanning means for scanning the mask and the wafer relative to said projection optical system;

illuminating means for sequentially illuminating the mask in an illumination area narrower than the pattern along a scanning direction, while said scanning means synchronously scans the mask and the wafer relative to said projection optical system, so as to expose and transfer the mask pattern onto the wafer;

detecting means for detecting information regarding exposure to produce detection results, before exposing and transferring the pattern onto the wafer by said illuminating means; and display means for displaying exposure information, including an illuminance distribution of the illumination area, obtained from the detection results.

20. An apparatus according to claim 19, wherein said detection means comprises an illuminance measurement means for measuring illuminance of the illumination area.

21. An apparatus according to claim 20, wherein said illuminance measurement means comprises a line sensor including a plurality of light receiving elements aligned at least in the scanning direction.

22. An apparatus according to claim 20, wherein said scanning means comprises mask scanning means and wafer scanning means, with said illuminance measurement means being disposed on said wafer scanning means.

23. An apparatus according to claim 19, further comprising a light source which supplies pulsed light accompanied by energy variations at each emission of the pulsed light.

24. An apparatus according to claim 23, wherein said light source comprises an excimer laser.

25. An exposure apparatus, comprising:

a projection optical system for projecting a pattern on a mask onto a wafer;

scanning means for scanning the mask and the wafer relative to said projection optical system;

illuminating means for sequentially illuminating the mask in an illumination area narrower than the pattern along a scanning direction, while said scanning means synchronously scans the mask and the wafer relative to said projection optical system, so as to expose and transfer the mask pattern onto the wafer;

detecting means for detecting information regarding exposure to produce detection results, before exposing and transferring the pattern onto the wafer by said illuminating means; and display means for displaying exposure information, including an integrated value of the illuminance in a direction perpendicular to the scanning direction of the illumination area, obtained from the detection results.

26. An apparatus according to claim 25, wherein said detection means comprises illuminance measurement means for measuring illuminance of the illumination area.

27. An apparatus according to claim 25, wherein said illuminance measurement means comprises a line sensor including a plurality of light receiving elements aligned at least in the scanning direction.

28. An apparatus according to claim 27, wherein said scanning means comprises mask scanning means and wafer scanning means, with said illuminance measurement means being disposed on said wafer scanning means.

29. An apparatus according to claim 25, further comprising a light source which supplies pulsed light accompanied by energy variations at each emission of the pulsed light.

30. An apparatus according to claim 29, wherein said light source comprises an excimer laser.

31. An exposure apparatus, comprising:

a projection optical system for projecting a pattern on a mask onto a wafer;

scanning means for scanning the mask and the wafer relative to said projection optical system;

illuminating means for sequentially illuminating the mask in an illumination area narrower than the pattern along a scanning direction, while said scanning means synchronously scans the mask and the wafer relative to said projection optical system, so as to expose and transfer the mask pattern onto the wafer;

detecting means for detecting information regarding exposure to produce detection results, before exposing and transferring the pattern onto the wafer by said illuminating means; and display means for displaying exposure information, including an exposure distribution in a one-shot exposure area on the wafer, obtained from the detection results.

32. An apparatus according to claim 31, wherein said detection means comprises illuminance measurement means for measuring illuminance of the illumination area.

33. An apparatus according to claim 32, wherein said illuminance measurement means comprises a line sensor including a plurality of light receiving elements aligned at least in the scanning direction.

34. An apparatus according to claim 32, wherein said scanning means comprises mask scanning means and wafer scanning means, with said illuminance measurement means being disposed on said wafer scanning means.

35. An apparatus according to claim 31, further comprising a light source which supplies pulsed light accompanied by energy variations at each emission of the pulsed light.

36. An apparatus according to claim 35, wherein said light source comprises an excimer laser.

37. A method of manufacturing a semiconductor device, comprising the steps of:

providing a mask on which a pattern is formed;

providing a wafer onto which the pattern is projected by a projection optical system;

exposing and transferring the pattern onto the wafer, by synchronously scanning the mask and the wafer relative to the projection optical system and sequentially illuminating the mask in an illumination area narrower than the pattern along a scanning direction;

detecting information regarding exposure to produce detection results, before exposing and transferring the pattern onto the wafer; and displaying exposure information, including an illuminance distribution of the illumination area, obtained from the detection results.

38. A method of manufacturing a semiconductor device, comprising the steps of:

providing a mask on which a pattern is formed;

providing a wafer onto which the pattern is projected by a projection optical system;

exposing and transferring the pattern onto the wafer, by synchronously scanning the mask and the wafer relative to the projection optical system and sequentially illuminating the mask in an illumination area narrower than the pattern along a scanning direction;

detecting information regarding exposure to produce detection results, before exposing and transferring the pattern onto the wafer; and displaying exposure information, including an integrated value of illuminance in a direction perpendicular to the scanning direction of the illumination area, obtained from the detection results.

39. A method of manufacturing a semiconductor device, comprising the steps of:

providing a mask on which a pattern is formed;

providing a wafer onto which the pattern is projected by a projection optical system;

exposing and transferring the pattern onto the wafer, by synchronously scanning the mask and the wafer relative to the projection optical system and sequentially illuminating the mask in an illumination area narrower than the pattern along a scanning direction;

detecting information regarding exposure to produce detection results, before exposing and transferring the pattern onto the wafer; and displaying exposure information, including an exposure distribution in a one-shot exposure area on the wafer, obtained from the detection results.

* * * * *

UNITED STATES PATENT AND TRADEMARK OFFICE
CERTIFICATE OF CORRECTION

PATENT NO. : 5,898,477

DATED : April 27, 1999

INVENTOR : KEIJI YOSHIMURA, ET AL.

Page 1 of 2

It is certified that error appears in the above-identified patent and that said Letters Patent is hereby corrected as shown below:

ON THE COVER PAGE:

At item [56], "References Cited", under "U.S. PATENT DOCUMENTS", "4,947,919 8/1990 Muraki et al." should read --4,974,919 12/1990 Muraki et al.-- .

COLUMN 1:

line 47, "patten" should read --pattern--.

COLUMN 2:

line 11, "patten" should read --pattern--.

COLUMN 15:

line 28, "semiconducter" should read --semiconductor--;
line 42, "semiconducter" should read --semiconductor--;
line 52, "semiconducter" should read --semiconductor--;
line 55, "semiconducter" should read --semiconductor--;
line 59, "semiconducter" should read --semiconductor--;

UNITED STATES PATENT AND TRADEMARK OFFICE
CERTIFICATE OF CORRECTION

PATENT NO. : 5,898,477
DATED : April 27, 1999
INVENTOR : KEIJI YOSHIMURA, ET AL.

It is certified that error appears in the above-identified patent and that said Letters Patent is hereby corrected as shown below:

COLUMN 15:

line 63, "semiconducter" should read --semiconductor--;
and
    line 66, "semiconducter" should read --semiconductor--.

COLUMN 16:

line 13, "semiconducter" should read --semiconductor--;
and
    line 19, "semiconducter" should read --semiconductor--.

Signed and Sealed this

Fifteenth Day of February, 2000

Q. TODD DICKINSON

*Attest:*

*Attesting Officer*       *Commissioner of Patents and Trademarks*